United States Patent
Kobayashi et al.

(10) Patent No.: US 7,704,329 B2
(45) Date of Patent: Apr. 27, 2010

(54) SEMICONDUCTOR SUBSTRATE CLEANING METHOD AND SEMICONDUCTOR SUBSTRATE CLEANING MACHINE

(75) Inventors: Kenji Kobayashi, Osaka (JP); Hiroshi Oshita, Tokyo (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 11/702,529

(22) Filed: Feb. 6, 2007

(65) Prior Publication Data

US 2007/0181153 A1 Aug. 9, 2007

(30) Foreign Application Priority Data

Feb. 8, 2006 (JP) .............................. 2006-031508

(51) Int. Cl.
*B08B 1/04* (2006.01)
(52) U.S. Cl. ............................................ 134/6; 134/26
(58) Field of Classification Search ........................ 134/2
See application file for complete search history.

(56) References Cited

U.S. PATENT DOCUMENTS

| | | | | |
|---|---|---|---|---|
| 4,476,601 A | * | 10/1984 | Oka | 15/88.3 |
| 6,616,516 B1 | * | 9/2003 | Ravkin et al. | 451/194 |
| 6,733,596 B1 | * | 5/2004 | Mikhaylichenko et al. | 134/6 |
| 2002/0096191 A1 | * | 7/2002 | Lofaro et al. | 134/6 |
| 2002/0162572 A1 | * | 11/2002 | Chou et al. | 134/2 |
| 2003/0110658 A1 | * | 6/2003 | Treur | 34/58 |

FOREIGN PATENT DOCUMENTS

| | | | |
|---|---|---|---|
| JP | 5-217979 | | 8/1993 |
| JP | 2000-237700 A | * | 9/2000 |
| JP | 2000-311878 A | * | 11/2000 |

OTHER PUBLICATIONS

Machine Translation of Japanese Patent Application No. 2000-311878 by Masami Otani, published Nov. 7, 2000.*
Machine Translation of Japanese Patent Application No. 2000-237700 by Masami Otani, published Sep. 5, 2000.*

* cited by examiner

*Primary Examiner*—Michael Kornakov
*Assistant Examiner*—Ryan Coleman
(74) *Attorney, Agent, or Firm*—McDermott Will & Emery LLP

(57) ABSTRACT

A semiconductor substrate cleaning method includes a first cleaning step of cleaning the surface of a semiconductor substrate with the use of a first brush and a second cleaning step of cleaning the surface of the semiconductor substrate with the use of a second brush after the first cleaning step. The second cleaning step is performed under a condition that suppresses recontamination of the surface of the semiconductor substrate in comparison with the first cleaning step.

11 Claims, 27 Drawing Sheets

US 7,704,329 B2

SEMICONDUCTOR SUBSTRATE CLEANING METHOD AND SEMICONDUCTOR SUBSTRATE CLEANING MACHINE

CROSS REFERENCE TO RELATED APPLICATIONS

This Non-provisional application claims priority under 35 U.S.C. §119(a) on Patent Application No. 2006-31508 filed in Japan on Feb. 8, 2006, the entire contents of which are hereby incorporated by reference.

FIELD OF THE INVENTION

The present invention relates to a semiconductor substrate cleaning method by which particles on a semiconductor substrate are reduced by removing particles efficiently and preventing re-adhesion of the removed particles to the semiconductor substrate.

BACKGROUND ART

As a method for removing particles adhering to the surface of a semiconductor substrate, brush cleaning may be employed. In the brush cleaning, particles are removed by a combination of lift-off action, electrical repulsion and the like of a cleaning solution and physical action by friction of a brush.

In the conventional brush cleaning of a semiconductor substrate, a semiconductor substrate is driven and rotated while a brush is moved along the surface of the substrate with a cleaning solution supplied onto the surface of the substrate. Particularly, in recent years, a brush cleaning mechanism is incorporated in a CMP (Chemical Mechanical Polishing) system in some cases so as to be used for removing abrasive grain in a polishing solution and polishing dust and the like generated by polishing.

As a typical surface treating machine that performs the brush cleaning, there are known in general a semiconductor substrate cleaning machine using a cup-shaped (disk-shaped) blush shown in FIG. 27 and a semiconductor substrate cleaning machine using a cylindrical (roll) blush shown in FIG. 28.

In the semiconductor substrate cleaning machine using the cup-shaped blush shown in FIG. 27, a semiconductor substrate 11 is held by a vacuum chuck or an edge chuck (not shown) and is rotated, and a brush 12 removes particles 17 from the semiconductor substrate 11. The brush 12 is mounted at a cup-shaped (disk-shaped) jig 13, and an arm 15 connected to the jig 13 sweeps the surface of the semiconductor substrate 11. During sweeping, a cleaning solution 14 is supplied onto the surface of the semiconductor substrate 11 from a nozzle 16 for surface treatment in combination with brushing by the brush 12 and action of the cleaning solution 14. The brush 12 is made of nylon, PVA (polyvinylalcohol), or the like usually.

On the other hand, in the cleaning machine using the cylindrical brush shown in FIG. 28, a brush 22 performs treatment for removing particles 26 from the surface of a semiconductor substrate 21 held and rotated similarly to that in the cleaning machine using the cup-shaped brush in FIG. 27. The blush 22 is provided radially around the outer periphery of a cylindrical brush support member 23 so as press the surface of the semiconductor substrate 21 while being rotated by rotation of the blush support member 23. During rotation, a cleaning solution 24 is supplied onto the surface of the semiconductor substrate 21 from the nozzle 25, thereby performing the surface treatment. The brush 12 is made of nylon, PVA (polyvinylalcohol), or the like usually, similarly.

In both the cleaning machine using the cup-shaped brush and the cleaning machine using the cylindrical brush, a cleaning step as depicted in FIG. 29 is performed. The brush is positioned apart from the semiconductor substrate in a standby state before cleaning. Cleaning is performed for a predetermined time period in such a manner that the rotated brush is pressed against the rotated semiconductor substrate at a given high pressing pressure (for example, about 50 g/cm$^2$ as pressure of the brush in contact with the surface of the semiconductor substrate is applied to the semiconductor substrate) while the cleaning solution is supplied. Thereafter, when the cleaning is terminated, the blush is moved away from the semiconductor substrate to be in the standby state. In general, cleaning solution supply is stopped concurrently with separation of the brush from the semiconductor substrate.

Japanese Patent No. 3140520(2) is listed as a patent document in this art.

SUMMARY OF THE INVENTION

Brush cleaning, however, involves the following problems.

FIG. 30 shows a state of brash cleaning of a semiconductor substrate in a cleaning machine using a cylindrical brush as one example. Specifically, while the semiconductor substrate 21 is rotated by a roller 27, the brush 22 provided around the outer periphery of the brash support member 23 is rotated and pressed against the semiconductor substrate 21 while the cleaning solution 24 is supplied from the nozzle 25. Physical action of the rotation and the pressing pressure of the brush 22 detaches particles 26 adhering to the surface of the semiconductor substrate 21 from the surface thereof. Further, the particles detached from the surface of the semiconductor substrate 21 are eliminated from the semiconductor substrate 21 together with the cleaning solution 24 by the centrifugal force generated by the rotation of the semiconductor substrate 21, by the force of gravity in the case where the semiconductor substrate 21 is arranged vertically, and the like.

To do so, the pressing pressure P of the brush 22 must be adjusted according to the semiconductor substrate 21.

In general, when the physical action of the brush 22 is strong, namely, when the pressing pressure P is higher than a given value, the particles 26 are removed effortlessly. Some of the particles 26 detached by the brush 22 from the surface of the semiconductor substrate 21 adhere to the surface of the brush 22. The particles 26 thus adhering to the brush 22 may adhere to the surface of the semiconductor substrate 21 again when the brush 22 is moved away from the semiconductor substrate 21 at termination of the cleaning. In other words, the surface of the semiconductor substrate 21 is contaminated again by the particles 26. Such re-adhesion is caused by friction between the brush 22 and the semiconductor substrate 21, by electrification of the semiconductor substrate 21 by action of the cleaning solution 24, by transfer of the particles 26 from the brush 22 to the surface of the semiconductor substrate 21 in moving the brush 22 away from the semiconductor substrate 21, and the like.

For preventing re-adhesion of the particles to the semiconductor substrate (recontamination), a method (Japanese Patent No. 3140520(2)), for example, has been proposed in which particles adhering to the brush are attracted so as not to fall off. This method, however, necessitates reconstruction and the like of the machine, which is difficult and raises cost.

In view of the foregoing, the present invention has its object of providing a semiconductor substrate cleaning method and a semiconductor substrate cleaning machine of which performance of removing particles from a semiconductor substrate is enhanced by suppressing re-adhesion of the particles to the semiconductor substrate (recontamination) which is caused by static electricity generated at brash cleaning.

The present inventors first conducted the following examination.

As factors of re-adhesion of particles to the semiconductor substrate (recontamination) in cleaning, there may be considered dirt adsorption to the substrate which is caused by a excessively dirty brush, poor adhesiveness of the particles to the brush, electrification of the substrate by static electricity, and the like. The present invention focuses on the electrification of the substrate by static electricity out of the above listed factors.

Before cleaning, particles may be adsorbed electrically or chemically to a semiconductor substrate. Such particles may be adsorbed at a part from which particles are hardly removed and are adsorbed firmly. In contrast, after cleaning, the particles adhere to the substrate principally by static electricity, which is weak adsorption than that before cleaning. In view of this aspect, the present inventors contemplated the following two-step cleaning.

First, strong cleaning (for example, pressing pressure of the brush against the substrate is increased, or the like) for detaching particles from the surface of the semiconductor substrate is performed. This detaches particles adhering to the surface of the semiconductor substrate from the surface thereof reliably. This strong cleaning, however, causes static electricity to allow some of the particles to adhere again to the surface of the semiconductor substrate.

In view of this, cleaning weaker than the strong cleaning (for example, pressing pressure of the brush against the substrate is reduced, or the like) is performed after the strong cleaning. The particles re-adhering by static electricity can be removed even by such weak cleaning more reliably than the particles adhering to the surface thereof at the beginning before the strong cleaning. This weak cleaning suppresses generation of static electricity to suppress further re-adhesion. Further, the suppression of generation of static electricity suppresses attraction and adhesion of the particles to the semiconductor substrate in separating the brush from the semiconductor substrate.

The weak cleaning for removing particles re-adhering by static electricity may be performed before the brush is moved away from the substrate at termination of the conventional brush cleaning or may be performed separately after termination of the conventional brush cleaning.

On the basis of the above contemplation, a method for cleaning a semiconductor substrate in the present invention includes the steps of: a first cleaning step of cleaning the surface of a semiconductor substrate with the use of a first brush; and a second cleaning step of cleaning, after the first cleaning step, the surface of the semiconductor substrate with the use of a second brush under a condition that suppresses recontamination of the surface of the semiconductor substrate in comparison with the first cleaning step.

In the semiconductor substrate cleaning method of the present invention, brush cleaning (first cleaning step) is performed first for detaching particles adhering to the surface of the semiconductor substrate. Thereafter, further brush cleaning (second cleaning step) is performed for removing the particles from the semiconductor substrate with re-adhesion of the particles detached from the surface of the semiconductor substrate to the surface thereof (recontamination) suppressed by suppressing generation of static electricity caused by friction between the brush and the semiconductor substrate. Static electricity is generated in the first brush cleaning step, which may involve re-adhesion of the particles once detached from the surface of the semiconductor substrate to the surface thereof. In the second brush cleaning step, however, generation of static electricity is suppressed, suppressing such particle re-adhesion. Re-adhesion of the particles to the surface of the semiconductor substrate by static electricity is comparatively weak, and therefore, the particles can be removed by the cleaning under the condition that suppresses generation of static electricity.

The first brush may be identical with the second brush. Namely, the first cleaning step and the second cleaning step may be performed by using the identical brush with the cleaning condition changed.

Preferably, a pressing pressure of the second brush against the semiconductor substrate in the second cleaning step is lower than a pressing pressure of the first brush against the semiconductor substrate in the first cleaning step.

Cleaning power becomes stronger as the pressure (pressing pressure) of the brush pressing against the semiconductor substrate is higher. Therefore, higher pressing pressure is desirable for removing particles firmly adhering to the surface of the semiconductor substrate. High pressing pressure, however, increases the amount of static electricity generated, with a result that the particles once detached from the surface thereof are liable to adhere thereto again.

Under the circumstances, the second cleaning step of brush cleaning at a pressing pressure lower than that in the first brush cleaning step is performed after the first cleaning step of brush cleaning at a high pressing pressure. This enables removal of particles remaining on the semiconductor substrate while particle re-adhesion is suppressed by suppressing generation of static electricity.

These steps may be performed by using a single brush with the pressing pressure changed or by using the first brush and the second brush with different pressing pressures set.

Preferably, the position of the second brush in the second cleaning step is farther than the position of the first brush in the first cleaning step relative to the semiconductor substrate.

A general brush used for brush cleaning has a given flexibility so as to be compressed and shrunk to some extent when pressed against the semiconductor substrate. For this reason, the position of the brush can be changed in a direction separating from the semiconductor substrate even in the state where the brush remains in contact with the surface of the semiconductor substrate.

By doing so, the pressing pressure of the brush against the semiconductor substrate in the second cleaning step becomes lower than that in the first cleaning step, so that the particles can be removed reliably with particle re-adhesion suppressed, as described above. Further, difference in position of the brush between the first cleaning step and the second cleaning step eliminates the need to measure and control the pressing pressure of the brush in cleaning, with a result that the semiconductor substrate cleaning method of the present invention can be achieved more effortlessly. The steps may be achieved by moving a single brush or by arranging separate brushes at different positions.

It is also preferable that the first brush and the second brush are cylindrical and the diameter of the second brush is smaller than the diameter of the first brush.

When the first cleaning step and the second cleaning step are performed with the use of the first cylindrical brash and the second cylindrical brush which have different diameters and of which axes are arranged at the same position relative to the semiconductor substrate, the pressing pressures of the brushes against the semiconductor substrate become different therebetween. As a result, the effects of the present invention that particles are removed with re-adhesion thereof suppressed are obtained reliably. This case also eliminates the need to measure and control the pressing pressure in every cleaning step.

Preferably, the second brush is made of a material softer than the first brush.

In this case, though the first brush and the second brush are the same in size, form, and position at cleaning, the pressing pressure of the brush in the second cleaning step becomes lower than that in the first cleaning step. Hence, the effects of the present invention can be obtained reliably with the need to measure and control the pressing pressure in every cleaning step eliminated.

It is also preferably that each of the first brush and the second brush includes a brush main body and protrusions provided at the surface of the brush main body and the height of the protrusions of the second brush is smaller than the height of the protrusions of the first brush.

With the difference in height of the protrusions between the first brush and the second brush, the pressing pressure of the brush against the semiconductor substrate is differentiated between in the first cleaning step and in the second cleaning step. Namely, cleaning in the second cleaning step is performed at the pressing pressure lower than that in the first cleaning step, attaining the effects of the present invention. As well, the pressing pressure needs not be measured and control in every brush cleaning step.

The first cleaning step and the second cleaning step may be performed by a single cleaning machine.

In this case, cleaning can be performed in a single semiconductor substrate cleaning machine, which enables brash cleaning in a saved space in a product line or the like.

Preferably, the first cleaning step and the second cleaning step are performed by separate cleaning machines.

A plurality of cleaning machines share the first cleaning step and the second cleaning step, thereby increasing the working efficiency. A single cleaning machine that performs both the first cleaning step and the second cleaning step requires plural different settings to be set for the respective cleaning steps. In contrast, the respective separate cleaning machines for performing the first cleaning step and the second cleaning steps perform respective cleaning with respective single setting set. This is effective for simplifying the respective cleaning machines and the respective steps in the machines.

Favorably, diluted hydrofluoric acid, ammonia water, organic acid, or functional water is used as a cleaning solution. When brush cleaning is performed with such a cleaning solution supplied onto the surface of the semiconductor substrate, the particles can be detached and removed from the surface of the semiconductor substrate reliably.

The functional water herein is obtainable by dissolving hydrogen, ozone, or the like into water, which is effective for suppressing oxidation of the semiconductor substrate in cleaning.

The first brush and the second brush are preferably made of a macromolecular material. With the use of such the brushes, the particles can be removed from the surface of the semiconductor substrate reliably. The macromolecular material includes nylon, PVA, and the like, for example.

A semiconductor substrate cleaning machine of the present invention includes: a first brush for cleaning the surface of a semiconductor substrate; and a second brush for cleaning the surface of the semiconductor substrate, wherein cleaning by the second brush is performed under a condition that suppresses recontamination of the surface of the semiconductor substrate in comparison with the first cleaning step.

In the semiconductor substrate cleaning machine of the present invention, the strong cleaning using the first brush (first cleaning) can detach particles adhering to the surface of the semiconductor substrate. The parcels once detached from the surface of the semiconductor substrate, however, may adhere to the surface thereof again (recontamination). In view of this, the brush cleaning using the second brush (second cleaning) is performed thereafter under the condition where static electricity is hardly generated. This removes the re-adhering particles. In the second cleaning, generation of static electricity is suppressed, with a result that further re-adhesion of the particles is suppressed.

In the semiconductor substrate cleaning machine of the present invention, it is preferable that the first brush and the second brush are cylindrical and the diameter of the second brush is smaller than the diameter of the first brush.

With the use of the first cylindrical brash and the second cylindrical brush having different diameters, two kinds of brash cleaning with different pressing pressures can be performed effortlessly, which means a semiconductor substrate cleaning machine that can perform brush cleaning reliably with particle re-adhesion suppressed.

Preferably, the second brush is made of a material softer than the first brush.

It is also preferable that each of the first brush and the second brush includes a brush main body and protrusions provided at the surface of the brush main body and the height of the protrusions of the second brush is smaller than the height of the protrusions of the first brush.

Either arrangement suppresses re-adhesion of the particles detached from the surface of the semiconductor substrate by the first cleaning to the surface thereof (recontamination of the surface of the semiconductor substrate), and the performance of removing the particles from the surface of the semiconductor substrate is enhanced.

As described above, in the semiconductor substrate cleaning method and the semiconductor substrate cleaning machine according to the present invention, cleaning is performed while the particles once detached from the surface of the semiconductor substrate is prevented from adhering again to the surface thereof, thereby removing the particles from the semiconductor substrate. Hence, cleaning at high cleanliness is enabled, and accordingly, brush cleaning of the semiconductor substrate can be performed excellently. The present invention necessitates no considerable modification of a conventional cleaning machine, and therefore, can be realized effortlessly at low cost.

DESCRIPTION OF THE PREFERRED EMBODIMENTS

Embodiment 1

A semiconductor substrate cleaning method and a semiconductor substrate cleaning machine according to Embodiment 1 of the present invention will be described hereinafter with reference to the drawings.

Figure 1:
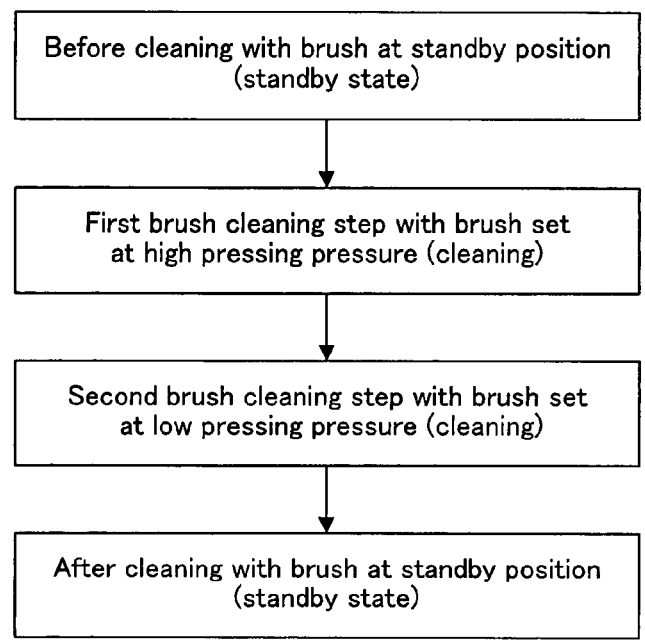
FIG. 1 is a flowchart depicting a flow of a semiconductor substrate cleaning method according to Embodiment 1.

FIG. 1 is a flowchart depicting a flow of the semiconductor substrate cleaning method according to the present embodiment. As depicted in FIG. 1, in the semiconductor substrate cleaning method of the present embodiment, the flow starts from a standby state before cleaning, proceeds to first brush cleaning and second brush cleaning for respective predetermined time periods, and then, terminates. In the second brush cleaning step, a pressing pressure of a brush is set lower than that in the first brush cleaning, so that particles can be removed with re-adhesion of the particles to the surface of a semiconductor substrate (recontamination of the surface of the semiconductor substrate) suppressed by suppressing generation of static electricity. The term "high pressing pressure and low pressing pressure" in FIG. 1 implies, as will be described later, relative degrees of the pressing pressure in comparison between two cleaning steps.

Figure 2:
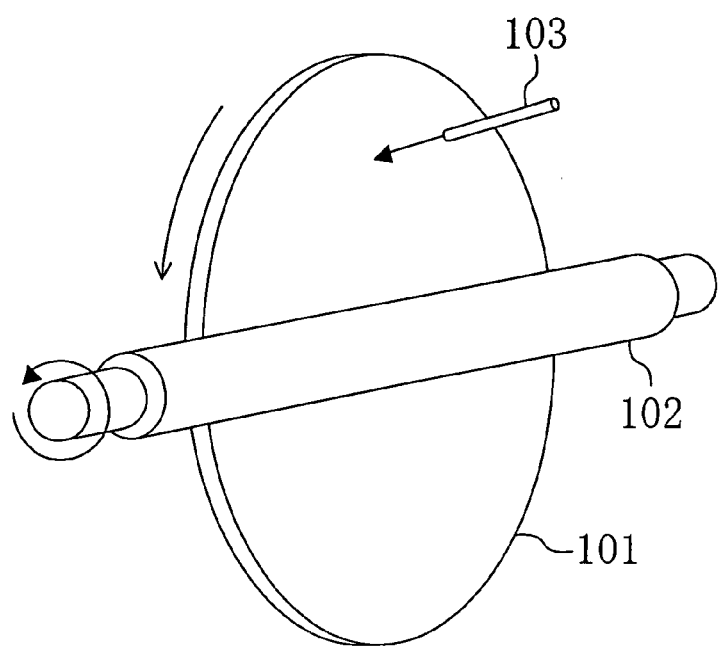
FIG. 2 is a perspective view showing a positional relationship between a semiconductor substrate and a cylindrical brush in the semiconductor substrate cleaning method according to Embodiment 1.

FIG. 2 shows the state where such brush cleaning is performed. Herein, a semiconductor substrate 101 to be cleaned is arranged vertically and rotated, and cleaning is performed by rotating a cylindrical brush 102 and pressing it against the semiconductor substrate 101. During the cleaning, a cleaning solution supply nozzle 103 supplies a cleaning solution onto the semiconductor substrate 101.

Figure 3:
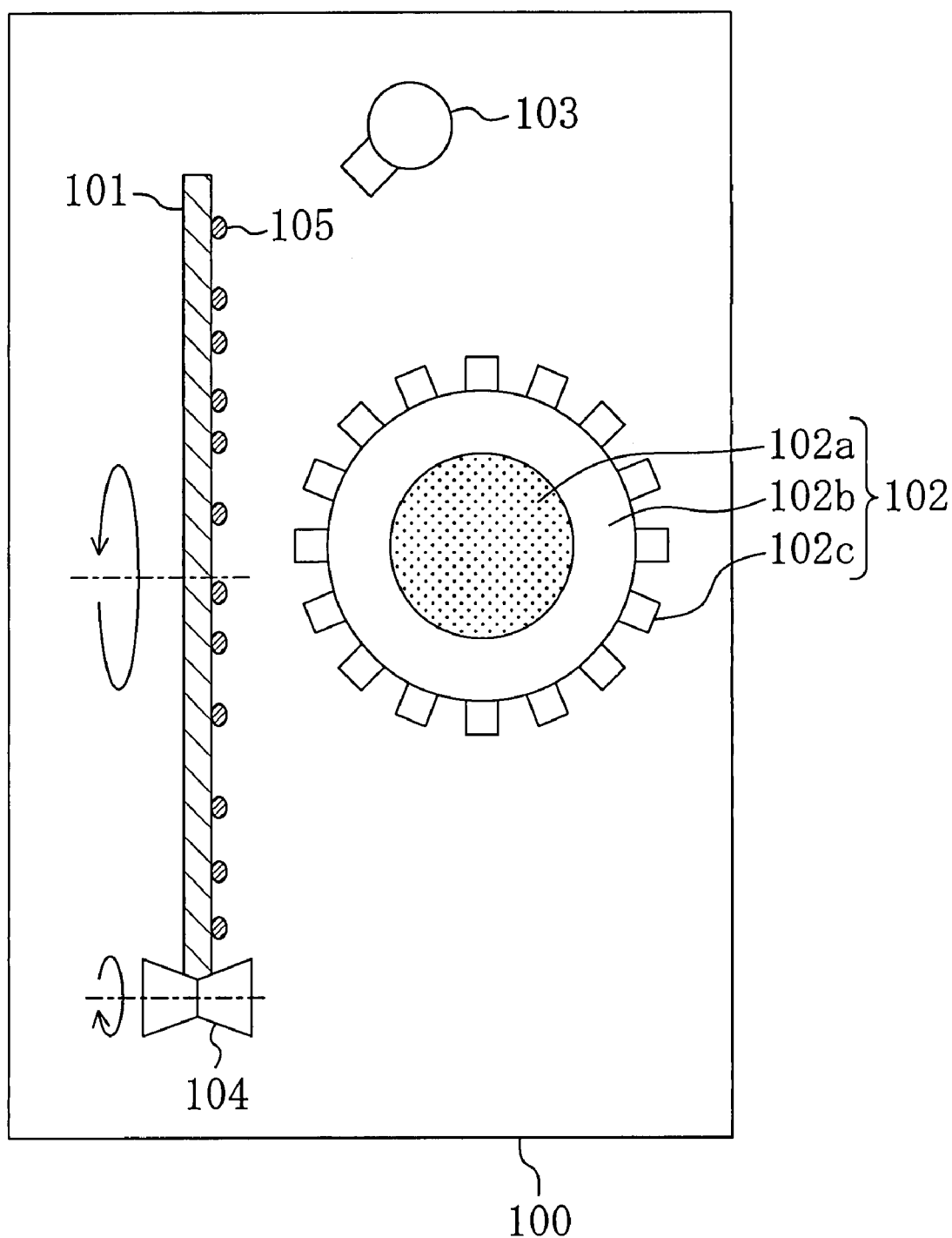
FIG. 3 is an illustration showing a semiconductor substrate cleaning machine according to Embodiment 1 in a state before cleaning in FIG. 1.

FIG. 3 shows schematically a main part of a semiconductor substrate cleaning machine that performs the semiconductor substrate cleaning method of the present embodiment when viewed in a direction of the rotation axis of the cylindrical brush 102 wherein the machine is in the arrangement in FIG. 2. As shown in FIG. 3, the semiconductor substrate cleaning machine of the present embodiment includes a treatment chamber 100, in which the semiconductor substrate 101 is arranged vertically. The semiconductor substrate 101 is held at the lower part thereof by a roller 104 and is rotated by rotating the roller 104. The oval arrows in FIG. 3 indicate the respective rotating directions of the roller 104 and the semiconductor substrate 101. Particles 105 to be removed by brush cleaning adhere to the surface of the semiconductor substrate 101. Though the single roller 104 for supporting the semiconductor substrate 101 is illustrated in FIG. 1, a plurality of rollers may be provided for supporting the semiconductor substrate 101.

Referring to the cylindrical brush 102, a brush support member 102a supports a brush main body 102b, around the outer periphery of which a plurality of protrusions 102 are provided. The brush main body 102b and the protrusions 102c are integrally formed and made of, for example, PVA, but the present invention is not limited thereto. The cylindrical brush 102b is moved so as to press the semiconductor substrate 101 for cleaning.

During cleaning, a cleaning solution supply nozzle 103 provided within the treatment chamber 100 supplies a cleaning solution 106 onto the semiconductor substrate 101. The cleaning solution 106 may be, for example, diluted hydrofluoric acid, ammonia water, organic acid, functional water, or the like and is selected according to the semiconductor substrate 101 and the kind of particles to be removed. The organic acid includes, for example, citric acid, oxalic acid, glyoxylic acid, succinic acid, lactic acid, formic acid, and the like. The functional water is obtainable by dissolving hydrogen, ozone, or the like into water, which is effective for suppressing oxidation of a semiconductor substrate. Specifically, the functional water is used for suppressing oxidation of, for example, copper wirings formed on the semiconductor substrate 101.

Figure 4:
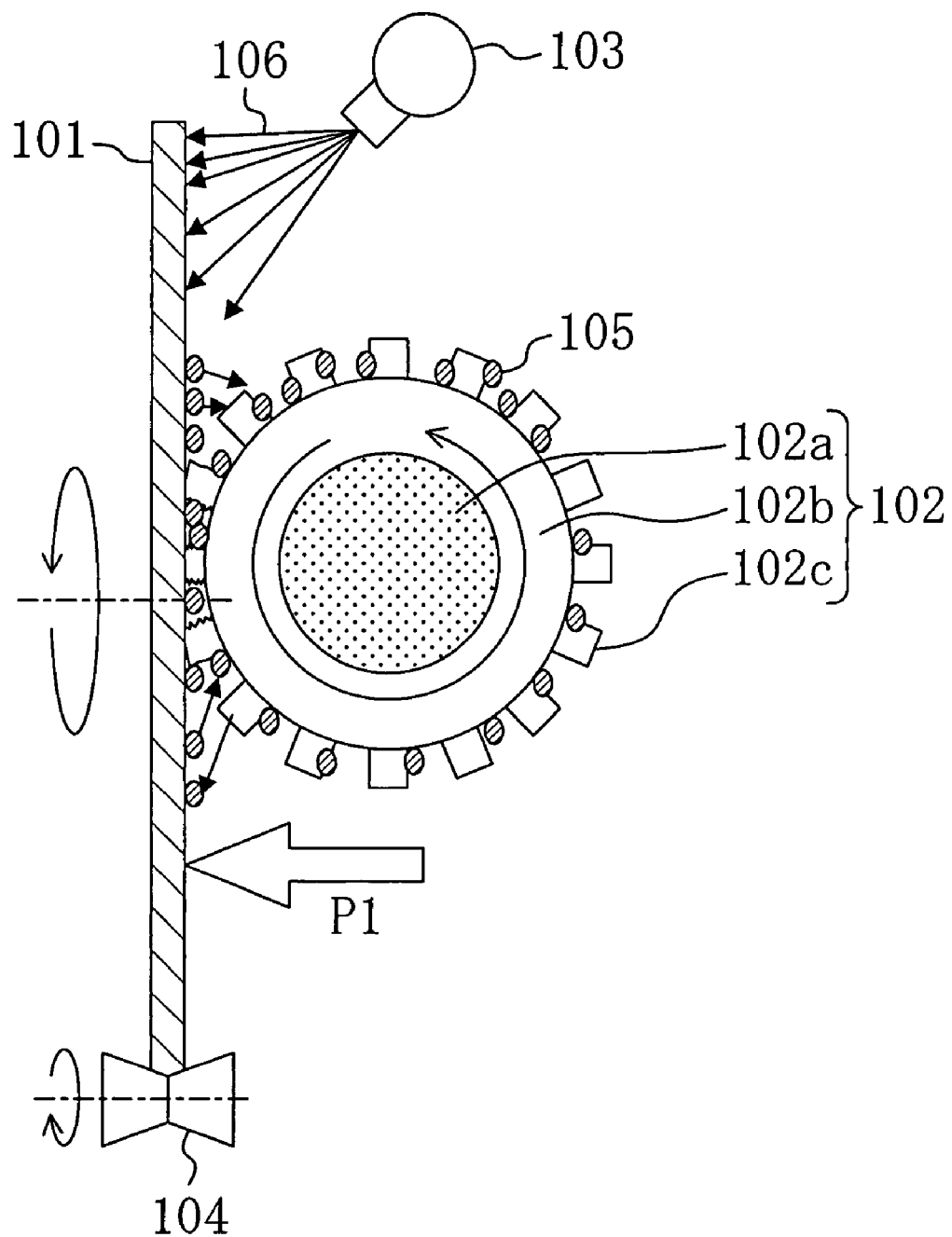
FIG. 4 is an illustration showing a first brush cleaning step at a high pressing pressure of the brush in the semiconductor substrate cleaning method according to Embodiment 1.
Figure 5:
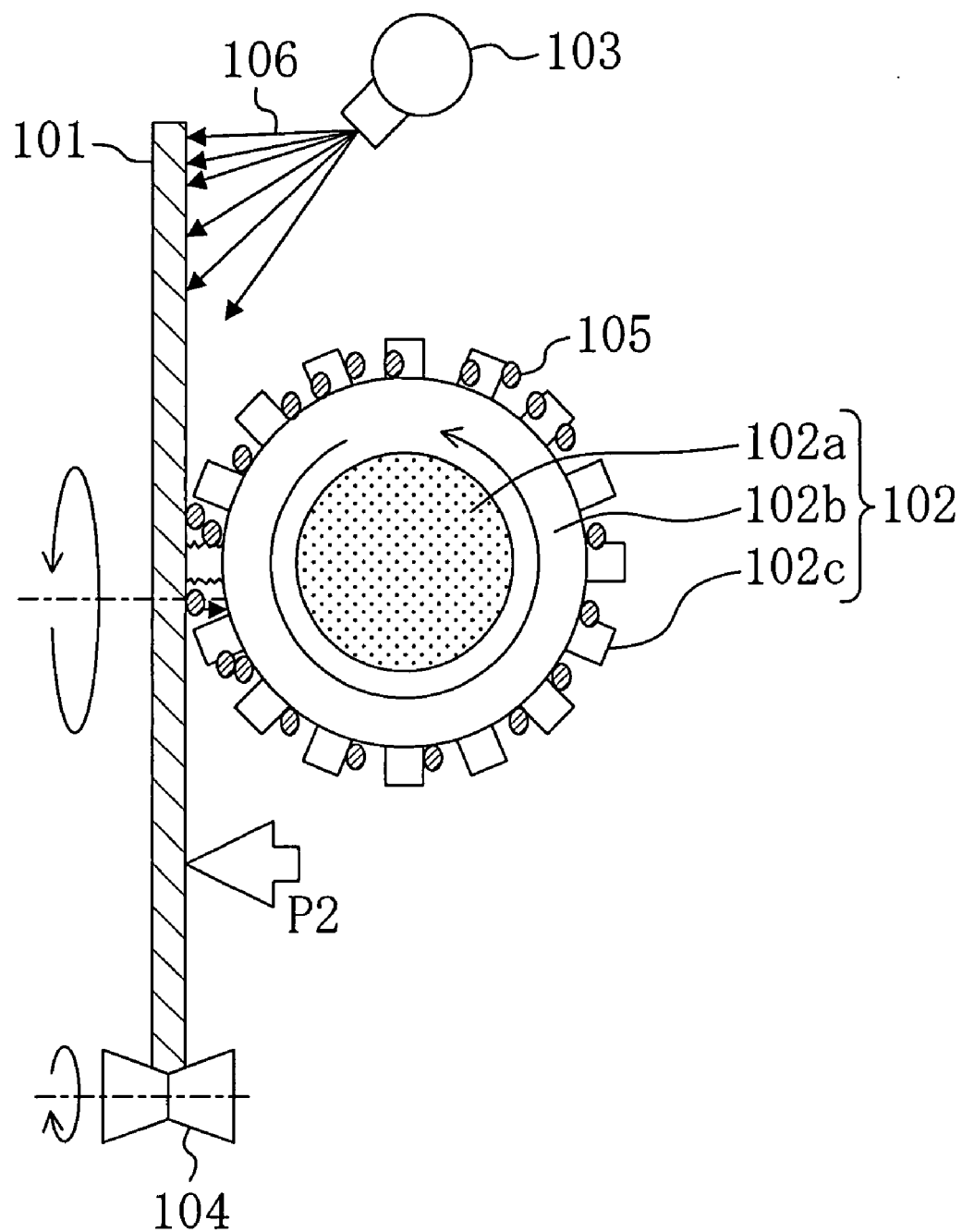
FIG. 5 is an illustration showing a second brush cleaning step at a low pressing pressure of the brush in the semiconductor substrate cleaning method according to Embodiment 1.

FIG. 4 shows schematically a first brush cleaning step (see FIG. 1) using the semiconductor substrate cleaning machine shown in FIG. 3. As well, FIG. 5 shows a second brush cleaning step. Wherein, the treatment chamber 100 is omitted in FIG. 4 and FIG. 5. The respective steps shown in FIG. 3 though to FIG. 5 will be described along the flow of FIG. 1.

The semiconductor substrate cleaning machine shown in FIG. 3 is in a state before cleaning in FIG. 1. In this state, the cylindrical brush 102 is out of contact with and way from the semiconductor substrate 101, namely, is in a standby state.

Next, the first bush cleaning step is performed. In this step, as shown in FIG. 4, the cleaning solution 106 is supplied to the to-be-cleaned surface of the semiconductor substrate 101 from the cleaning solution supply nozzle 103. In parallel, the cylindrical brush 102 is rotated and pressed against the semiconductor substrate 101 so as to detach and remove the particles 105 adhering to the surface of the semiconductor substrate 101 from the surface thereof. The detached particles 105 are eliminated together with the cleaning solution 106 flowing downward from the semiconductor substrate 101 by its gravity and the centrifugal force.

The number of rotation of the cylindrical brush 102 is set to 100 rpm while that of the semiconductor substrate 101 is set to 50 rpm, for example. Further, the pressing pressure P1 of the cylindrical brush 102 against the semiconductor substrate 101 is set to 50 g/cm$^2$, for example. Cleaning for 60 seconds with setting for efficient particle removal set detaches and removes the particles 105 from the semiconductor substrate 101.

Strictly saying, however, not all particles detached from the surface of the semiconductor substrate 101 are removed from the semiconductor substrate 101 together with the cleaning solution 106, and some of them remain in such a fashion that the particles adhere to the surface of the cylindrical brush 102 or adhere again to the surface of the semiconductor substrate 101. This might be because the pressing pressure P1 of the cylindrical brush 102 is comparatively high, and therefore, friction caused between the semiconductor substrate 101 and the cylindrical brush 102 generates static electricity to attract the particles 105. If the brush cleaning would be just stopped thereafter, namely, if the cylindrical brush 102 is stopped from rotating and is separated from the semiconductor substrate 101, the particles 105 remain adhering to the surface of the semiconductor substrate 101 electrified by the static electricity, as described as a problem to be solved.

In view of the foregoing, in the semiconductor substrate cleaning method of the present embodiment, the second brush cleaning step shown in FIG. 5 is performed after the first brush cleaning step shown in FIG. 4.

In the second brush cleaning step, cleaning is performed with a pressing pressure of the cylindrical brush 102 against the semiconductor substrate 101 set lower than that in the first brush cleaning step. The numbers of rotation of the semiconductor substrate 101 and the cylindrical brush 102 remain unchanged. Specifically, the second brush cleaning step is performed for 10 seconds with the pressing pressure P2 set to 2.5 g/cm$^2$ and the numbers of rotation of the cylindrical brush 102 and the semiconductor substrate 101 set to 100 rpm and 50 rpm, respectively, for example.

With the above arrangement, since the pressing pressure is lower than that in the first brush cleaning step, the particles 105 on the semiconductor substrate 101 can be removed with generation of static electricity suppressed. The particles 105 re-adhering to the surface of the semiconductor substrate 101 by static electricity can be removed effortlessly even by the cylindrical brush 102 at the comparatively low pressing pressure in the second brush cleaning step. This is because particle adhesion by static electricity is weaker than that before the first brush cleaning step. Thereafter, the cylindrical brush 102 is moved and separated from the semiconductor substrate 101. Since generation of static electricity has been suppressed to suppress electrification of the semiconductor substrate 101, re-adhesion of the particles 105 to the surface of the semiconductor substrate 101 is suppressed in moving the cylindrical brush 102 away from the semiconductor substrate 101.

Brush cleaning is terminated when the cylindrical brush 102 is separated from the semiconductor substrate 101, is stopped from rotating, and is moved to the predetermined initial position to be in the standby state.

As described above, when the second brush cleaning at the pressing pressure of the cylindrical brush 102 lower than that in the first brush cleaning step is performed after the first brush cleaning step for detaching the particles 105 adhering to the surface of the semiconductor substrate 101 therefrom, re-adhesion of the particles 105 to the semiconductor substrate 101 by static electricity is suppressed.

The semiconductor substrate cleaning method of the present embodiment can be reduced into practice without necessitating considerable modification of a semiconductor substrate cleaning machine that employs a conventional semiconductor substrate cleaning method and can be achieved at low cost effortlessly.

It is noted that the first brush cleaning step and the second brush cleaning step may be performed using a single cylindrical brush 102 with the pressing pressure changed or may be performed using different brushes. In the case using the different brushes, though the particles re-adhere to the semiconductor substrate by static electricity at the time when the first brush cleaning step is terminated in the state where a brush is away from the semiconductor substrate, the re-adhering particles are removed from the semiconductor substrate in the second brush cleaning step thereafter.

The aforementioned values of the pressing pressure and the numbers of rotation of the semiconductor substrate 101 and the cylindrical brush 102 are mere examples, and the present invention is not limited thereto.

Embodiment 2

A semiconductor substrate cleaning method and a semiconductor substrate cleaning machine according to Embodiment 2 will be described below with reference to the drawings.

Figure 6:
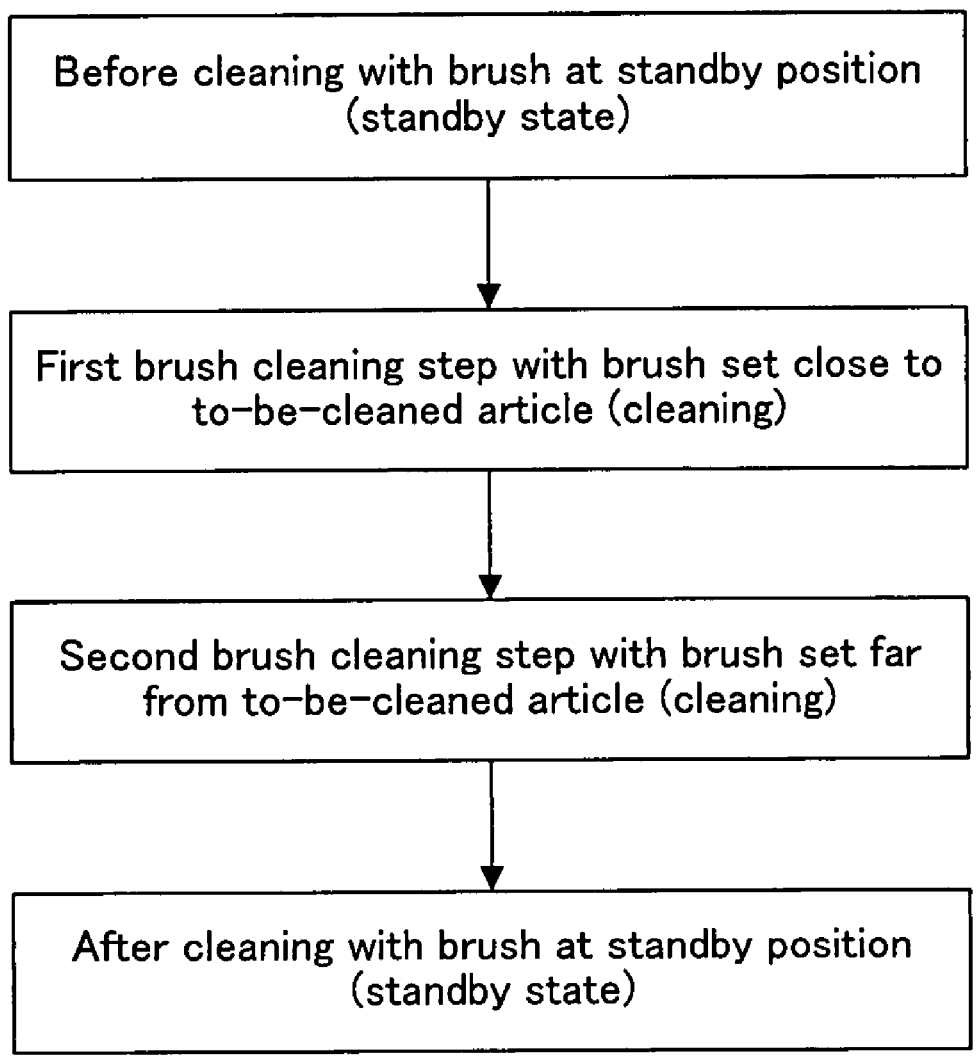
FIG. 6 is a flowchart depicting a flow of a semiconductor substrate cleaning method according to Embodiment 2.

FIG. 6 is a flowchart depicting a flow of the semiconductor substrate cleaning method according to Embodiment 2. The semiconductor substrate cleaning method of the present embodiment includes, similarly to the semiconductor substrate cleaning method of Embodiment 1 depicted in FIG. 1, a first brush cleaning step and a second brush cleaning step which are performed for respective predetermined time periods. In contrast to Embodiment 1 in which the second brush cleaning step is performed with the pressing pressure of the brush changed from that in the first brush cleaning step, the second brush cleaning step is performed with the position of the brush relative to the semiconductor substrate changed from that in the first brush cleaning step. Specifically, in the second brush cleaning step, the brush is set farther than that in the first brush cleaning step. This reduces the pressing pressure of the brush in the second brush cleaning step when compared with that in the first brush cleaning step, obtaining the same effects as in Embodiment 1. The term "brush set close to and far from to-be-cleaned article" in FIG. 6 implies relative distances in comparison in position of the brush between in the first brush cleaning step and in the second brush cleaning step.

The semiconductor substrate cleaning method of the present embodiment will be described below in detail along the flow of FIG. 6.

A semiconductor substrate cleaning machine that employs the semiconductor substrate cleaning method of the present invention is the same as the semiconductor substrate cleaning machine in Embodiment 1 shown in FIG. 3.

Herein, suppose that the position at which the cylindrical brush 102 is just in contact with the surface of the semiconductor substrate 101 is set as a point 0 (zero) for indicating the position of the cylindrical brush 102 relative to the semiconductor substrate 101. Further, suppose that a direction moving way from the semiconductor substrate 101 and a direction approaching the semiconductor substrate 101 with respect to the point 0 as a reference are set to a plus (+) direction and a minus (−) direction, respectively.

The state before cleaning in FIG. 6 is shown in FIG. 3. In this state, the cylindrical brush 102 is separated, for example, 30 mm from the semiconductor substrate 101, namely, is positioned at +30 mm point in the term of the above supposition. Then, cleaning is performed in such a manner that the cylindrical brush 102 is rotated and pressed against the semiconductor substrate 101 rotated by the roller 104 while the cleaning solution 106 is supplied from the cleaning solution supply nozzle 103, which is the same as in the semiconductor substrate cleaning method of Embodiment 1.

Figure 7:
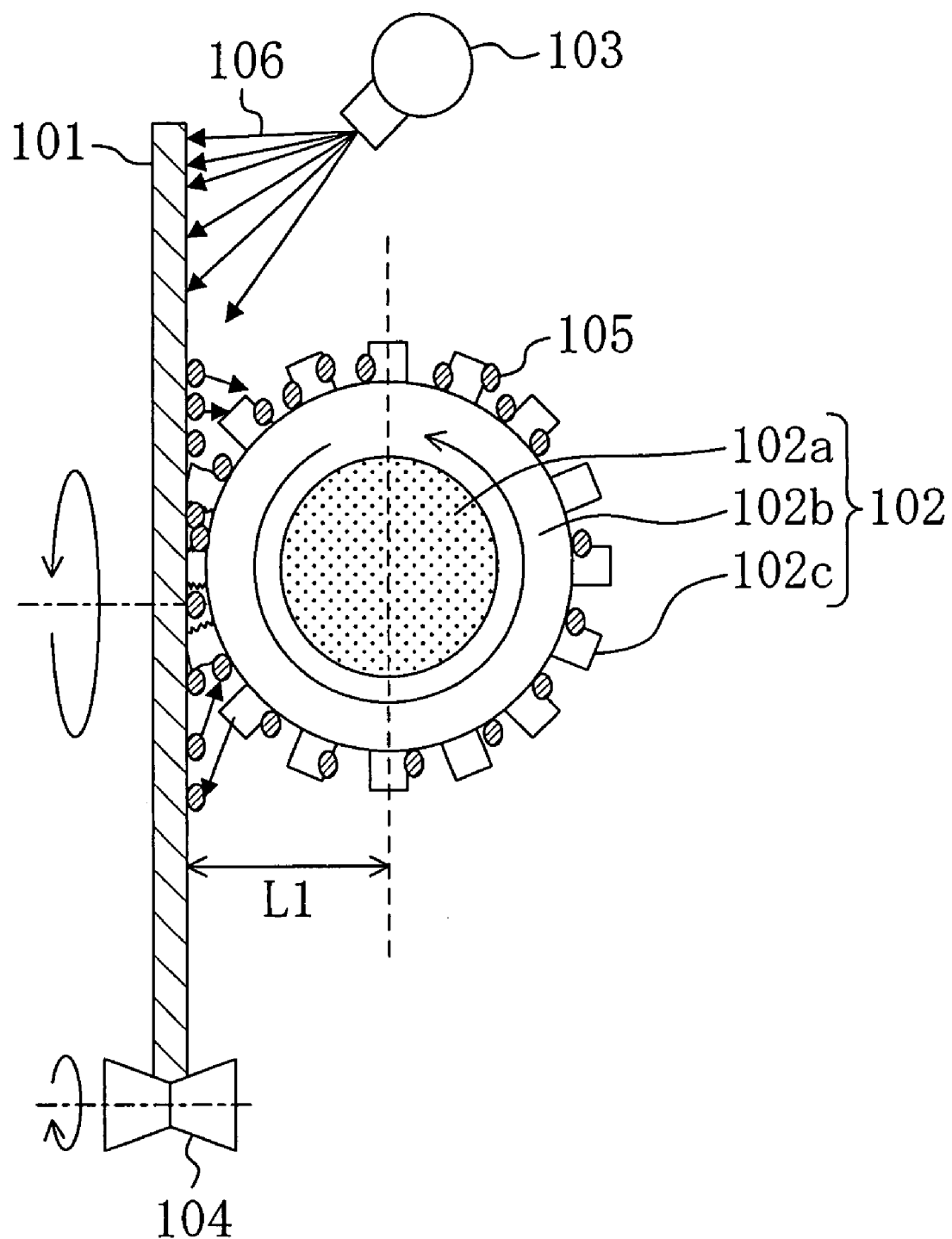
FIG. 7 is an illustration showing a first brush cleaning step in which a brush is arranged close to a semiconductor substrate in the semiconductor substrate cleaning method according to Embodiment 2.

FIG. 7 shows the state of the first brush cleaning step. In the first brush cleaning step, the cylindrical brush 102 is set at −1.0 mm point in the aforementioned term, and cleaning is performed for 60 seconds with the numbers of rotation of the cylindrical brush 102 and the semiconductor substrate 101 set to 100 rpm and 50 rpm, respectively. These settings attains effective detachment and removal of the particles 105 adhering to the surface of the semiconductor substrate 101 therefrom. The cylindrical brush 102 set at −1.0 mm point means that the cylindrical brush 102 is pressed against the semiconductor substrate 101 1.0 mm further toward the semiconductor substrate 101 from the point 0 at which the cylindrical brush 102 is in contact with the semiconductor substrate 101. This setting is enabled by using PVA or the like having flexibility as a material of the cylindrical brush 102 (especially, the protrusions 102c).

In FIG. 7, L1 indicates a distance from the axis of the cylindrical brush 102 to the surface of the semiconductor substrate 101 in the first brush cleaning step.

Though the above described first brush cleaning step detaches and removes the particles 105 from the surface of the semiconductor substrate 101, static electricity by friction is liable to be generated because the cylindrical brush 102 is set close to the semiconductor substrate 101. As a result, the particles 105 once detached from the surface of the semiconductor substrate are liable to adhere again the surface thereof and remain thereon.

Figure 8:
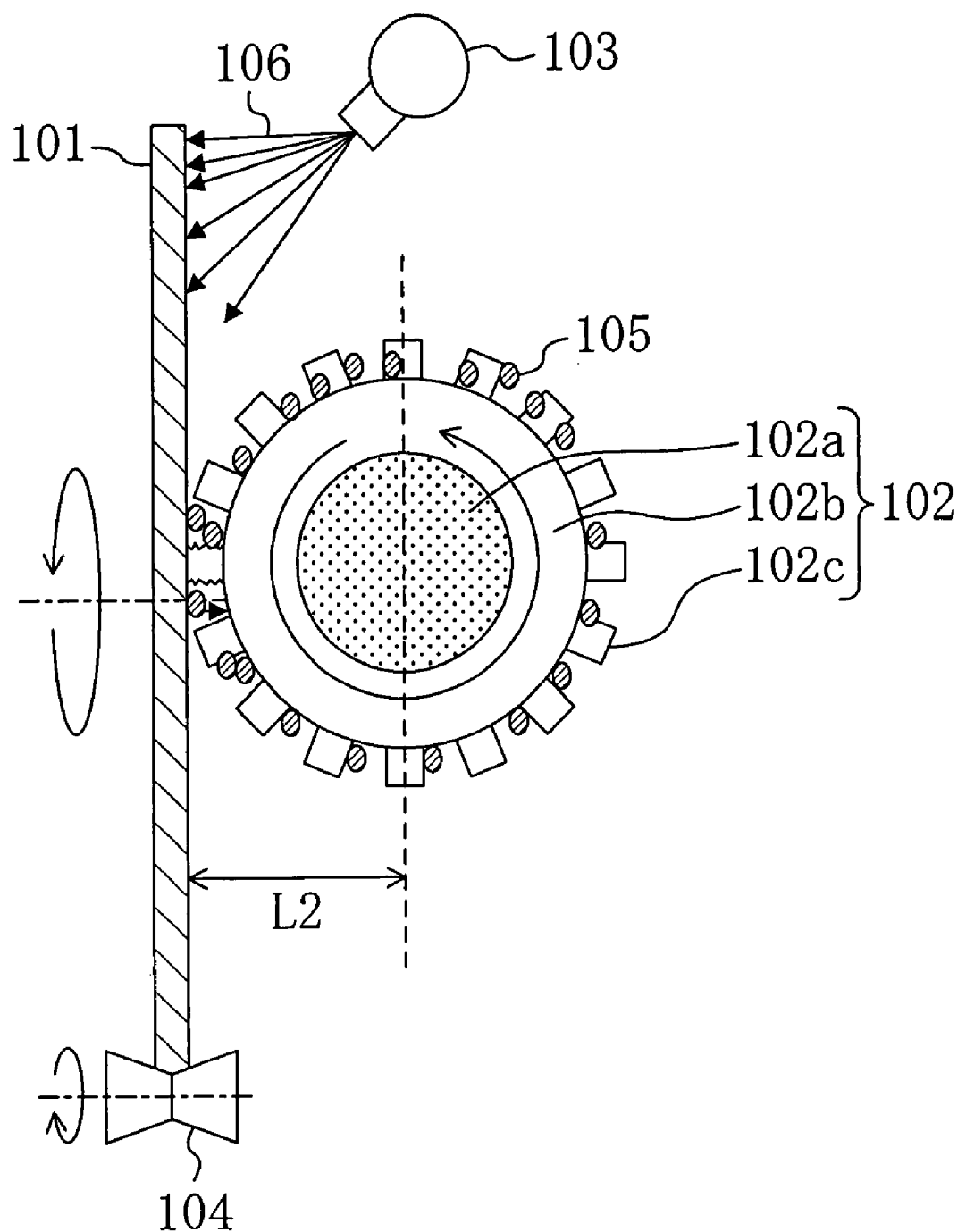
FIG. 8 an illustration showing a second brush cleaning step in which the brush is arranged far from the semiconductor substrate in the semiconductor substrate cleaning method according to Embodiment 2.

Under the circumstances, the second brush cleaning step shown in FIG. 8 is performed. In the second brush cleaning step, the cylindrical brush 102 is set at −0.1 mm point, which is the point 0.9 mm away from the semiconductor substrate 101 when compared with that in the first brush cleaning step.

In FIG. 8, L2 indicates a distance from the axis of the cylindrical brush 102 to the surface of the semiconductor substrate 101 in the second brush cleaning step. The cylindrical brush 102 is set away from the semiconductor substrate 101, which means that the distance L2 is larger than the distance L1 in the first brush cleaning step.

Under the aforementioned condition, when brush cleaning is performed for 10 seconds with the numbers of rotation of the cylindrical brush 102 and the semiconductor substrate 101 set to 100 rpm and 50 rpm, respectively, re-adhesion of the particles 105 to the semiconductor substrate 101 is suppressed while the particles 105 are removed from the semiconductor substrate 101. This is because positioning of the cylindrical brush 102 far from the semiconductor substrate 101 when compared with that in the first brush cleaning step reduces the pressing pressure and reduces friction to suppress generation of static electricity, thereby suppressing adhesion of the particles 105 to the semiconductor substrate 101.

As described above, when cleaning is performed with the position of the cylindrical brush 102 relative to the semiconductor substrate set farther than the position thereof which can detach the particles 105 effortlessly from the surface of the semiconductor substrate 101, the semiconductor substrate 101 can be cleaned with re-adhesion of the particles 105 suppressed.

According to the semiconductor substrate cleaning method of the present embodiment, only position change of the cylindrical brush 102 achieves the second brush cleaning step. This can be achieved more easily than in the semiconductor substrate cleaning method of Embodiment 1 that necessitates measuring the pressing pressure of the brush.

Embodiment 3

A semiconductor substrate cleaning method and a semiconductor substrate cleaning machine according to Embodiment 3 will be described below with reference to the drawings.

Figure 9:
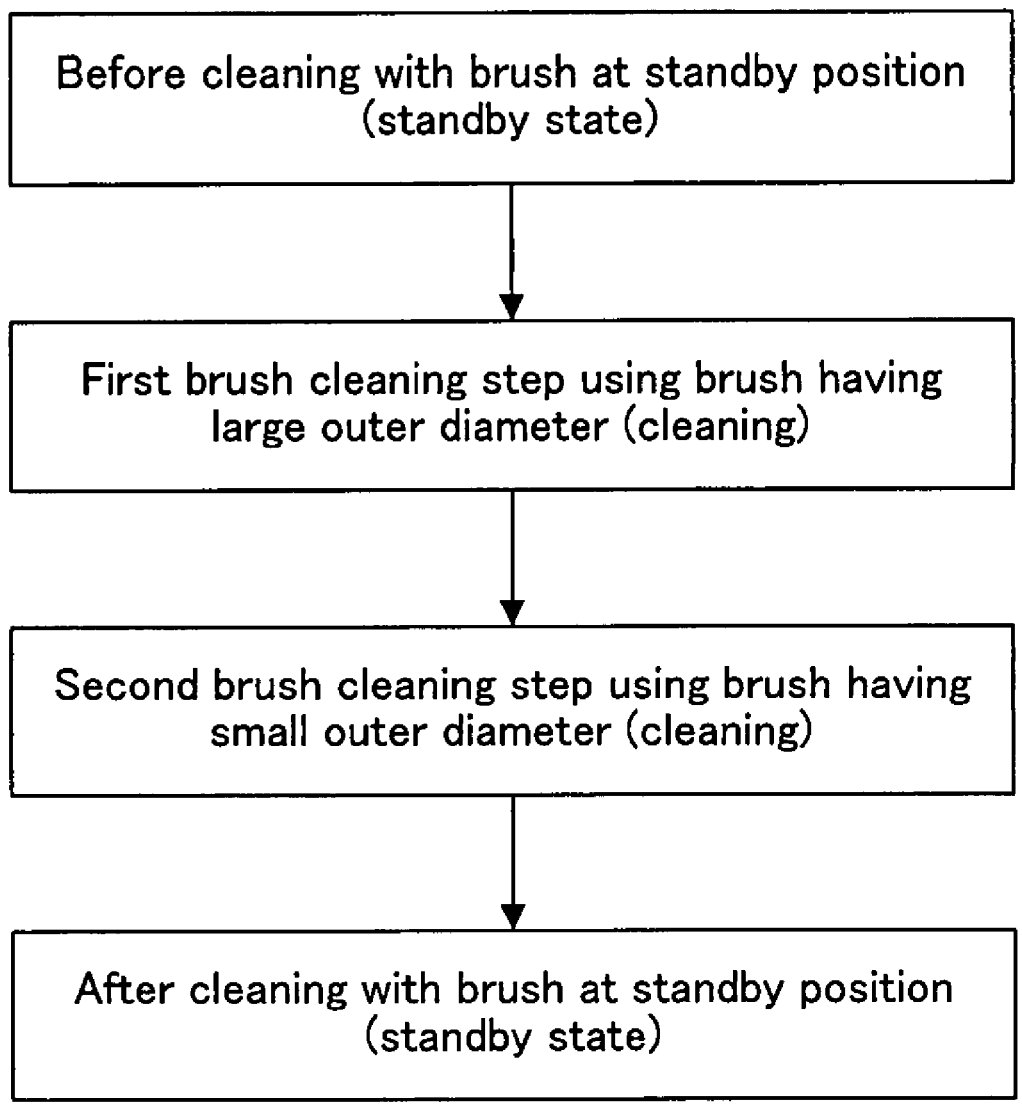
FIG. 9 is a flowchart depicting a flow of a semiconductor substrate cleaning method according to Embodiment 3.

FIG. 9 is a flowchart depicting a flow of the semiconductor substrate cleaning method according to Embodiment 3. The semiconductor substrate cleaning method of the present embodiment includes, similarly to the semiconductor substrate cleaning methods of Embodiments 1 and 2, a first brush cleaning step and a second brush cleaning step which are performed for respective predetermined time periods. Wherein, in the present embodiment, cylindrical brushes having different diameters are prepared and exchanged between the first and second brush cleaning steps. Specifically, the outer diameter of a cylindrical brush used in the second brush cleaning step is set smaller than that in the first brush cleaning step. The term "large outer diameter and small outer diameter" in FIG. 9 implies relative sizes of the brushes.

With the use of the brushes having different outer diameters, when the first and second brush cleaning steps are performed with the brushes set at the same position, the pressing pressures of the brushes against the semiconductor substrate become different from each other, attaining the same effects as in Embodiment 1.

Figure 10:
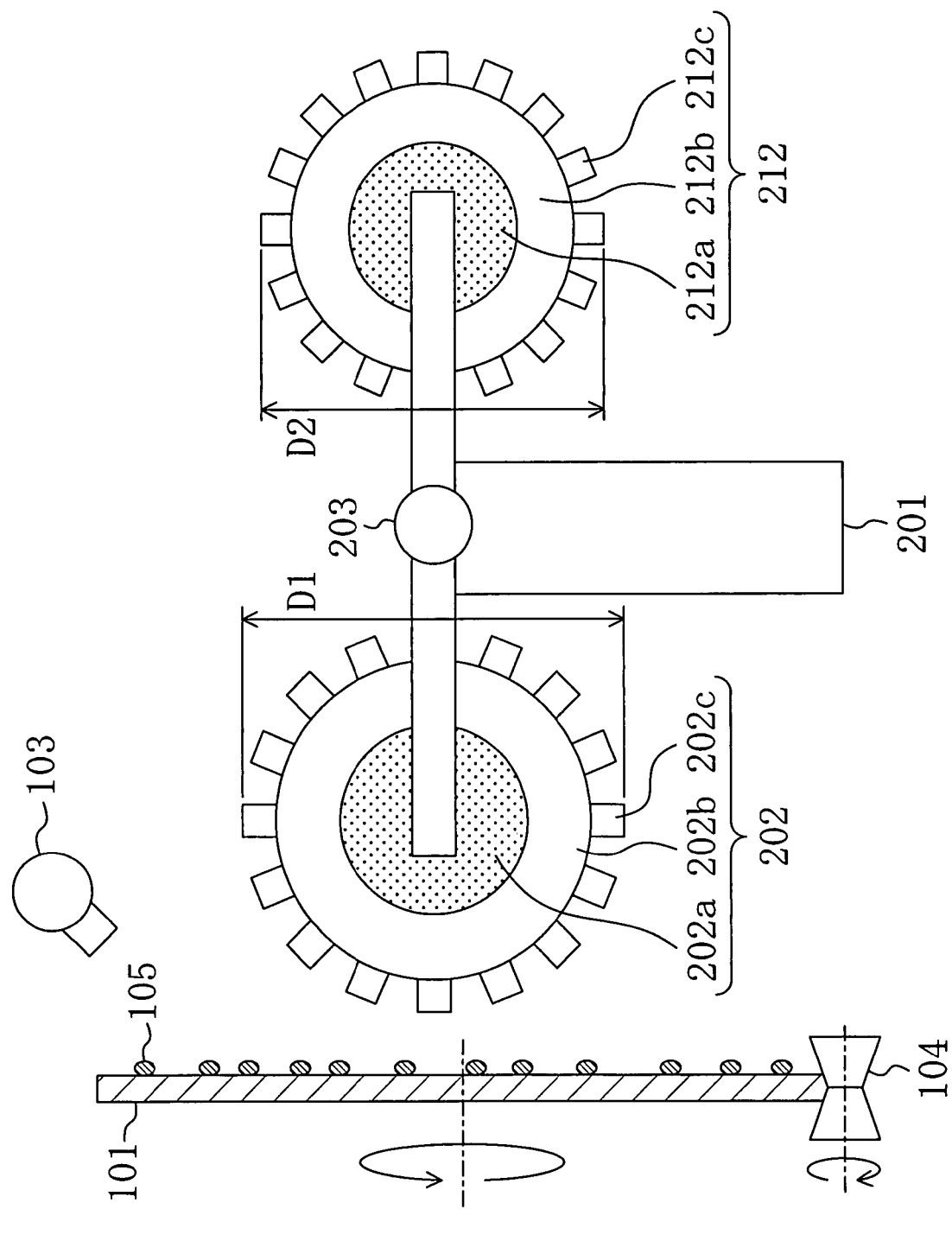
FIG. 10 is an illustration showing a semiconductor substrate cleaning machine according to Embodiment 3 in a state before cleaning in FIG. 9.

FIG. 10 shows one example of an arrangement in a semiconductor substrate cleaning machine that employs the semiconductor substrate cleaning method of the present embodiment. In the semiconductor substrate cleaning machine, the semiconductor substrate 101 is held by the roller 104 vertically and is rotated by rotating the roller 104. The cleaning solution supply nozzle 103 is provided for supplying a cleaning solution 106 onto the surface of the semiconductor substrate 101. Though the treatment chamber 100 is omitted, the above described arrangement is the same as that in the semiconductor substrate cleaning machine in Embodiment 1 shown in FIG. 3.

The semiconductor substrate cleaning machine of the present embodiment includes a first cylindrical brush 202 having an outer diameter D1 and a second cylindrical brush 212 having an outer diameter D2 smaller than the outer diameter D1. The first cylindrical brush 202 includes a brush support member 202a, a brush main body 202b supported by the brush support member 202a, and protrusions 202c provided around the outer periphery of the brush main body 202b. Similarly, the second cylindrical brush 212 includes a brush support member 212a, a brush main body 212b, and protrusions 212c.

The first cylindrical brush 202 and the second cylindrical brush 212 are provided at the respective ends of an arm 203 arranged on a support pole 201, the arm 203 serving as a brush exchange mechanism. Rotation of the arm 203 exchanges the first cylindrical brush 202 and the second cylindrical brush 212. The distance from the rotation center of the arm 203 to the axis of the first cylindrical brush 202 is equal to that from the rotation center of the arm 203 to the axis of the second cylindrical brush 212. Accordingly, either axis is positioned at the same point when the two cylindrical brushes 202, 212 are exchanged by rotating the arm 203 180°.

The outer diameter D1 of the first cylindrical brush 202 is set to 60 mm while the outer diameter D2 of the second cylindrical brush 212 is set to 55 mm, for example.

The semiconductor substrate cleaning method of the present embodiment will be described below in detail along the flow of FIG. 6.

The semiconductor substrate cleaning machine shown in FIG. 10 is in the standby state before cleaning in FIG. 9. The first and second cylindrical brushes 202, 212 are in the standby state where both of them are out of contact with the semiconductor substrate 101.

Figure 11:
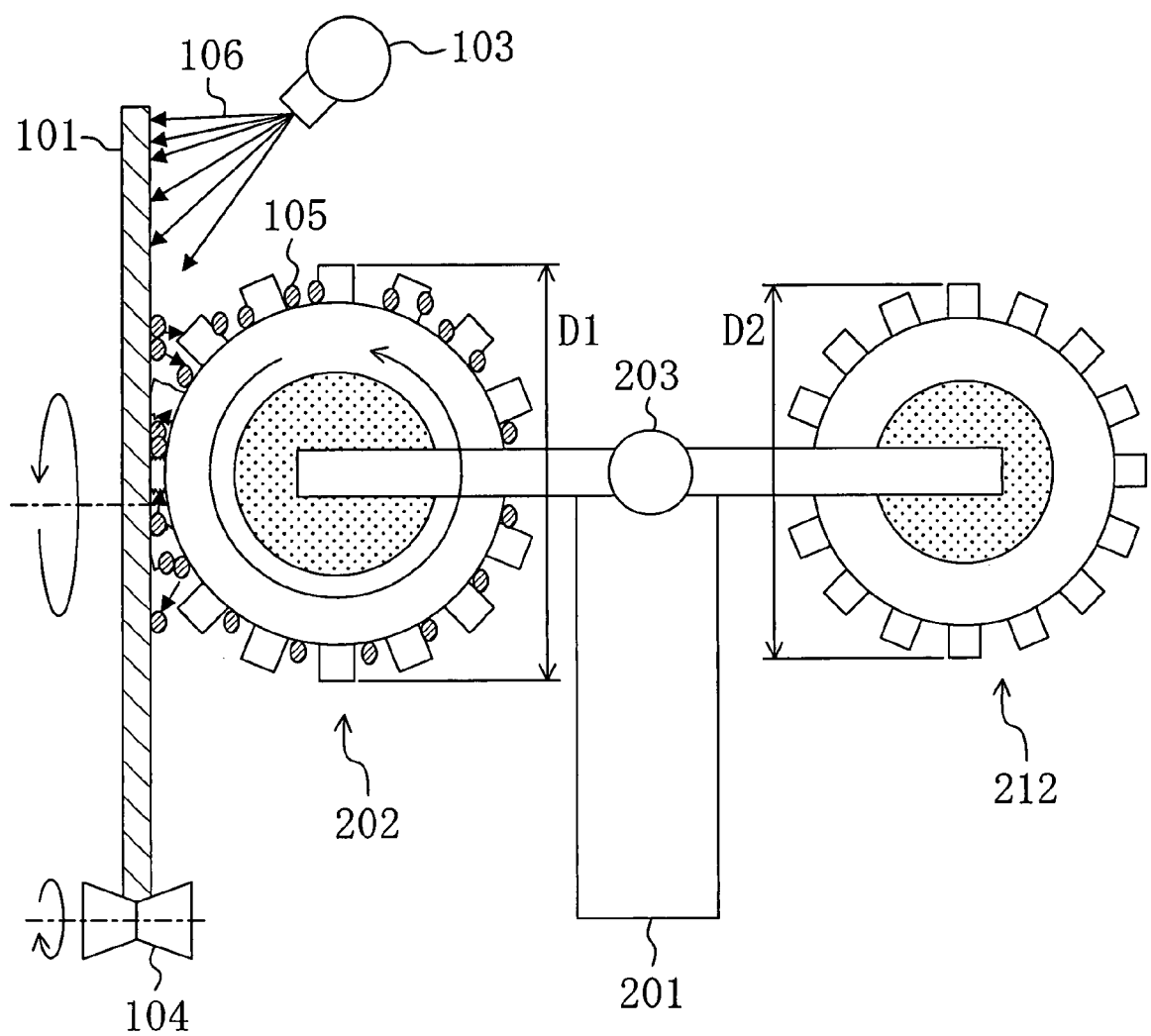
FIG. 11 is an illustration showing a first brush cleaning step using a brush having a large outer diameter in the semiconductor substrate cleaning method according to Embodiment 3.

Next, as shown in FIG. 11, the first brush cleaning step is performed in such a manner that the support pole 201 is moved to allow the first cylindrical brush 202 to be in contact with the semiconductor substrate 101 while the first cylindrical brush 202 is rotated. In parallel, the cleaning solution 103 is supplied from the cleaning solution supply nozzle 103.

The above described first brush cleaning step detaches and removes reliably the particles 105 adhering to the surface of the semiconductor substrate 101 therefrom. In the first brush cleaning step, however, the semiconductor substrate 101 is electrified, causing the particles 105 to adhere thereto again.

Figure 12:
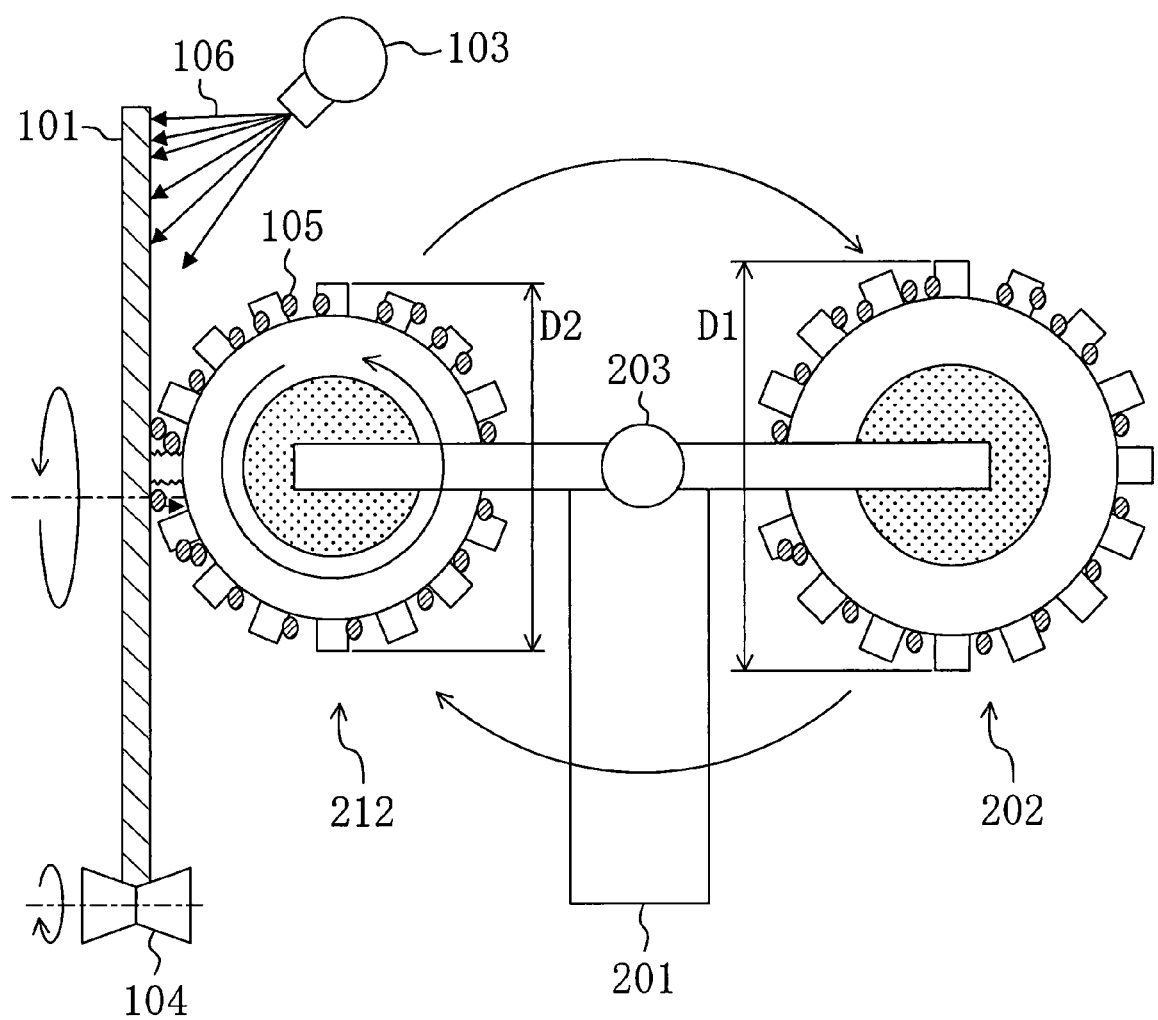
FIG. 12 is an illustration showing a second brush cleaning step using a brush having a small outer diameter in the semiconductor substrate cleaning method according to Embodiment 3.

Under the circumstances, in the semiconductor substrate cleaning method of the present embodiment, the second brush cleaning step is performed subsequently. To do so, the first cylindrical brush 202 is exchanged by the second cylindrical brush 212 by rotating the arm 203 with the semiconductor substrate 101 and the support pole 201 maintained at the current positions. FIG. 12 shows the state after the exchange (the state of the second brush cleaning step).

In the state shown in FIG. 12, brush cleaning as the second brush leaning step is performed using the second cylindrical brush 212 having the outer diameter D2 smaller than the outer diameter D1 of the first cylindrical brash 202. The axis of the second cylindrical brush 212 is positioned at the point at which the axis of the first cylindrical brash 202 has been positioned. Accordingly, with the small outer diameter, the pressing pressure of the second cylindrical brush 212 against the semiconductor substrate 101 becomes lower than that of the first cylindrical brush 202. As a result, less static electricity, which is caused by friction between the second cylindrical brush 212 and the semiconductor substrate 101, is generated when compared with that generated in the first brush cleaning step, suppressing re-adhesion of the particles 105 by static electricity.

Thus, the semiconductor substrate is cleaned with particle re-adhesion suppressed. In contrast to Embodiment 1, which necessitates measurement and control of the pressing pressure, the present embodiment, in which the outer diameters D1, D2 of the brushes are set as above, can realizes the first and second brush cleaning steps without necessitating such measurement and control.

In the first and second brush cleaning steps, the numbers of rotation of the semiconductor substrate 101 and the first and second cylindrical brushes 202, 212 are set to 50 rpm and 100 rpm, respectively. The first and second brush cleaning steps are preformed for 60 seconds and 10 seconds, respectively. Each value is, however, a mere example and is set as appropriate.

In addition, the semiconductor substrate cleaning machine shown in FIG. 10 to FIG. 12 is a mere example, and the present invention is not limited thereto. Any other arrangement may be applicable only if it includes two brushes having different outer diameters for cleaning a semiconductor substrate.

Embodiment 4

A semiconductor substrate cleaning method and a semiconductor substrate cleaning machine according to Embodiment 4 will be described below with reference to the drawings.

Figure 13:
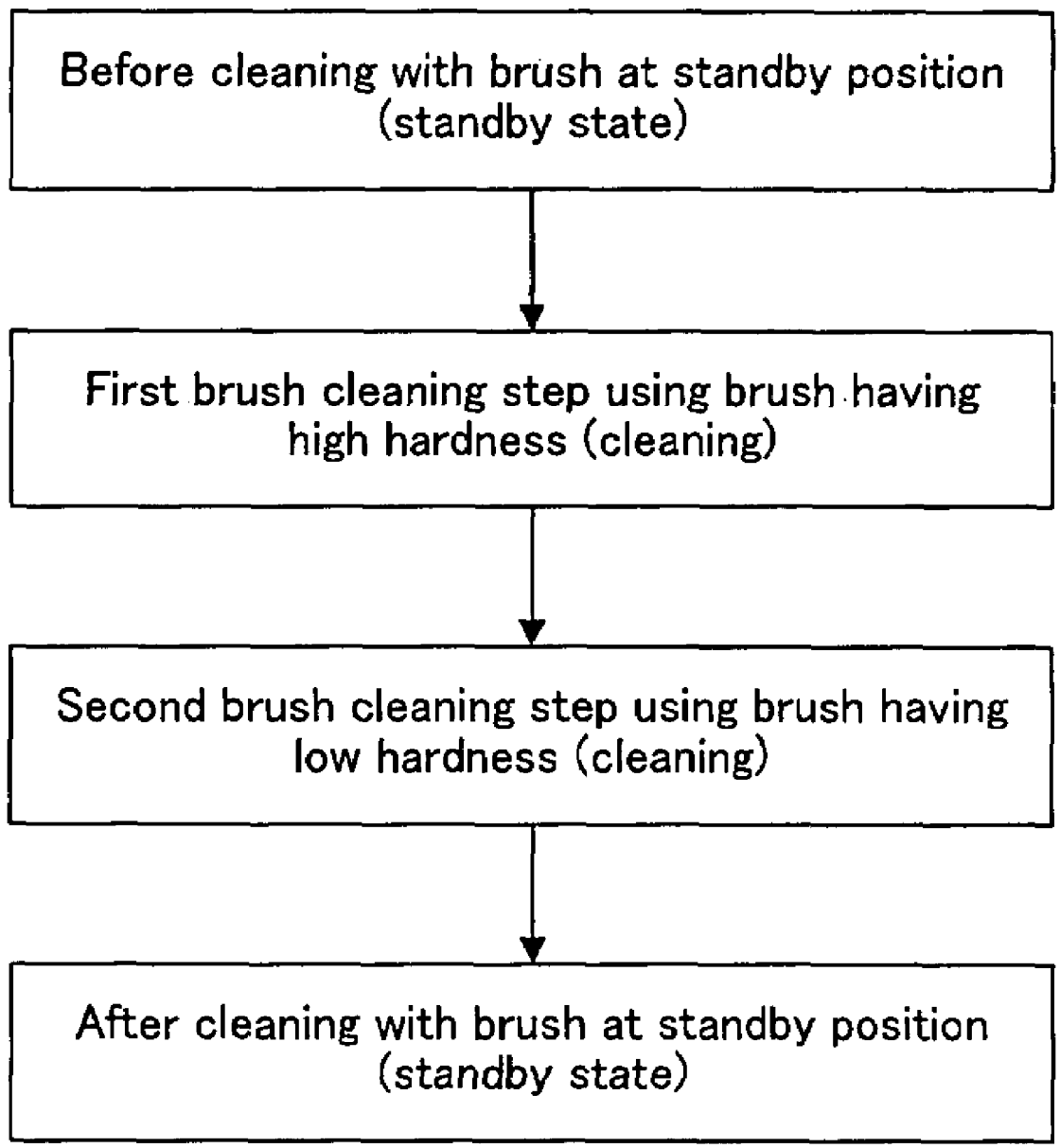
FIG. 13 is a flowchart depicting a flow of a semiconductor substrate cleaning method according to Embodiment 4.

FIG. 13 is a flowchart depicting a flow of the semiconductor substrate cleaning method according to Embodiment 4. The semiconductor substrate cleaning method of the present embodiment includes, similarly to the semiconductor substrate cleaning methods of the above described embodiments, a first brush cleaning step and a second brush cleaning step. In the present embodiment, a brush used in the second brush cleaning step is softer or has a hardness lower than a brush used in the first brush cleaning. In the second brush cleaning step, generation of static electricity and particle re-adhesion by the static electricity are suppressed. It is not required to control the pressing pressures of the brushes and the positions of the brushes relative to the semiconductor substrate in the respective brush cleaning steps. Wherein, the term "high hardness and low hardness" in FIG. 13 implies relative levels of the hardness of the brushes.

Figure 14:
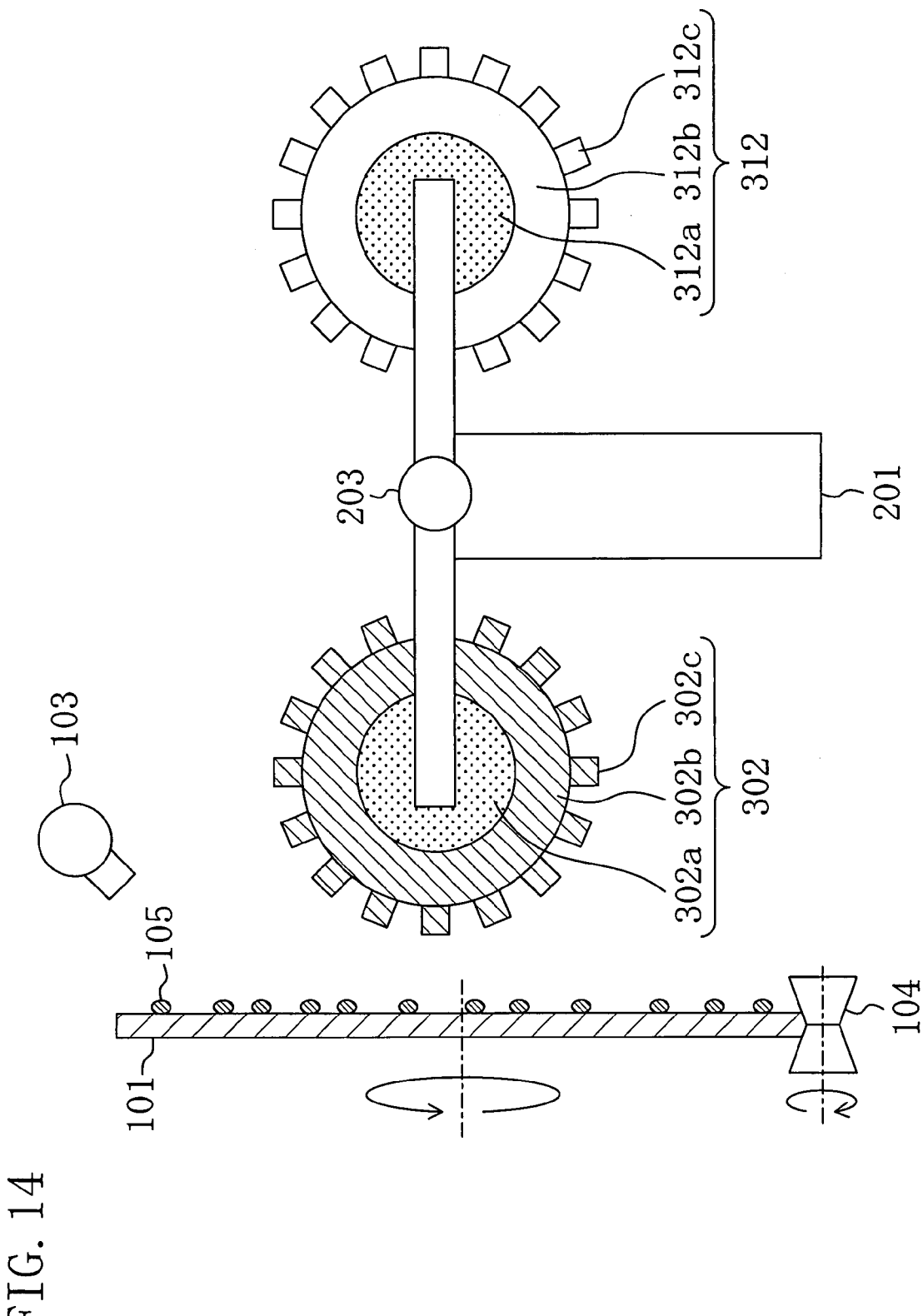
FIG. 14 is an illustration showing a semiconductor substrate cleaning machine according to Embodiment 4 in a state before cleaning in FIG. 13.

FIG. 14 shows one example of an arrangement in a semiconductor substrate cleaning machine that employs the semiconductor substrate cleaning method of the present embodiment. In the semiconductor substrate cleaning machine, the semiconductor substrate 101, the roller 104, and the cleaning solution supply nozzle 103 are arranged the same as those in the semiconductor substrate cleaning machine shown in FIG.

10. Further, a first cylindrical brush 302 and a second cylindrical brush 312 are provided at the respective ends of the arm 203 provided on the support pole 201, which is the same as that shown in FIG. 10. With this arrangement, rotation of the arm 203 exchanges the first cylindrical brush 302 and the second cylindrical brush 312.

In the semiconductor substrate cleaning machine of the present embodiment, the outer diameter of the first cylindrical brush 302 is equal to that of the second cylindrical brush 312, wherein the hardness of the second cylindrical brush 312 is lower than that of the first cylindrical brush 301. Specifically, the brush main body 312b and the protrusions 312c of the second cylindrical brush 312 are softer than the brush main body 302b and the protrusions 302c of the first cylindrical brush 302.

A macromolecular material is suitable as a material of the brushes. Specifically, the material includes PVA, nylon, polyurethane, acrylic resin, and the like, for example. With the use of such a material, brushes having different hardness can be prepared. Alternatively, in order to prepare brushes having different hardness, brushes may be made of different materials, or the ratios of pores formed in the material of the brushes may be changed. Further, any combination thereof may be employed.

Thus, exchange between the first cylindrical brush 302 and the second cylindrical brush 312 results in different pressing pressures of the brushes against the semiconductor substrate 101 even though the outer diameters are equal to each other and the positions of the brushes at cleaning are the same. Specifically, the pressing pressure in the second brush cleaning step is lower than the pressing pressure in the first brush cleaning step.

Hence, though particle re-adhesion by generation of static electricity is caused in the first brush cleaning step, it is suppressed in the second brush cleaning step, removing the particles reliably.

Figure 15:
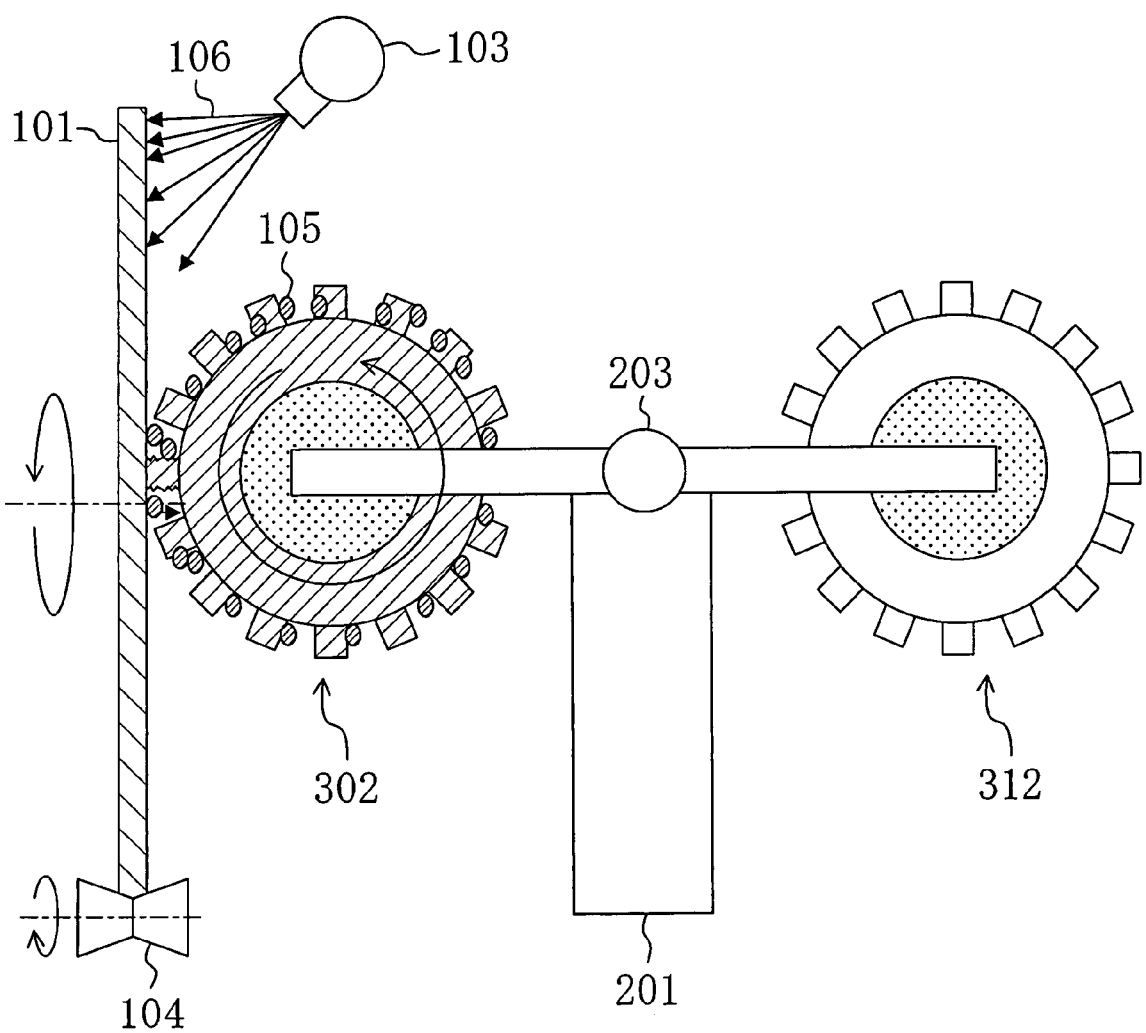
FIG. 15 is an illustration showing a first brush cleaning step using a brush having a high hardness in the semiconductor substrate cleaning method according to Embodiment 4.
Figure 16:
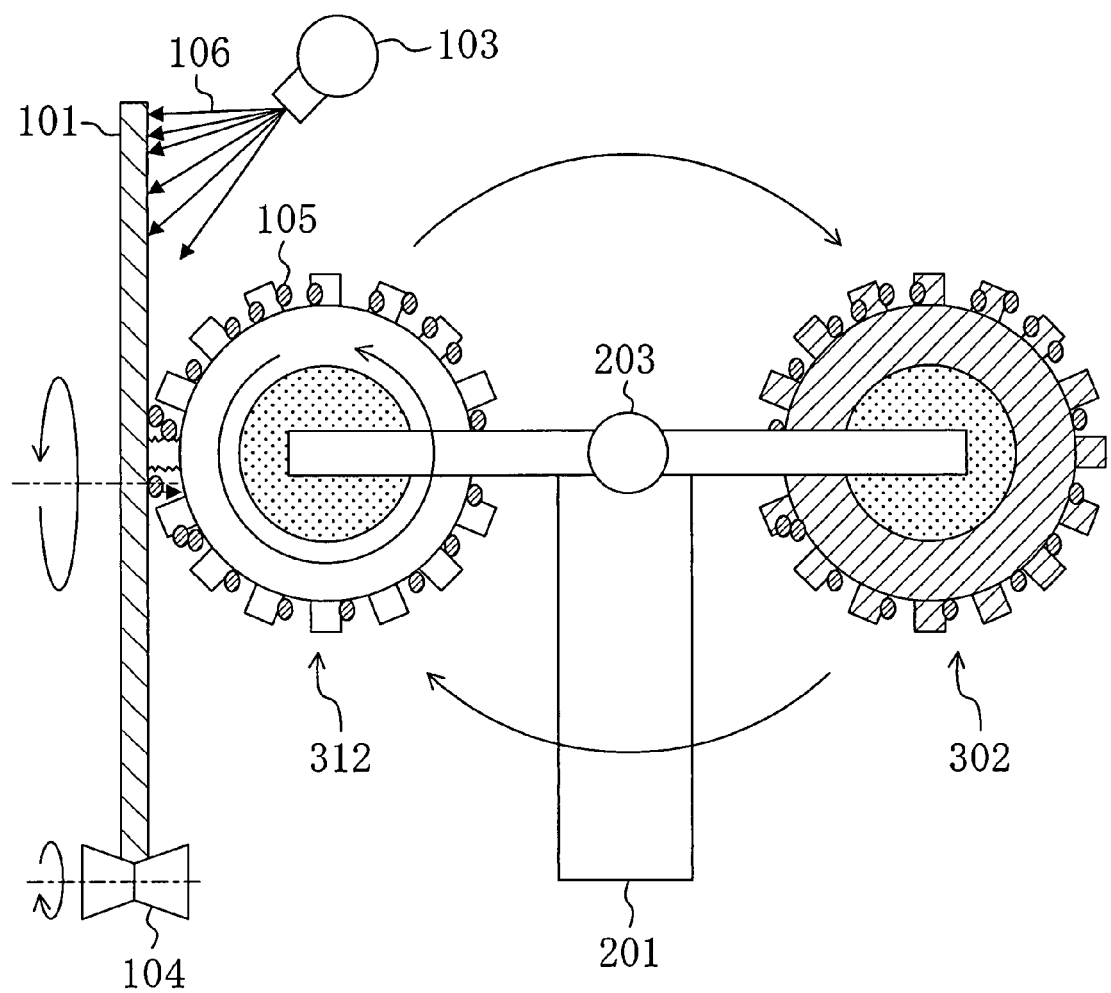
FIG. 16 is an illustration showing a second brush cleaning step using a brush having a low hardness in the semiconductor substrate cleaning method according to Embodiment 4.

In addition to FIG. 14, FIG. 15 and FIG. 16 show the semiconductor substrate cleaning method of the present embodiment in sequence along the flow of FIG. 13. The semiconductor substrate cleaning machine shown in FIG. 14 is in the standby state before cleaning. Then, the first cylindrical brush 302 is rotated and moved by moving the support pole 201 to be in contact with the semiconductor substrate 100, thereby starting the first brush cleaning step, as shown in FIG. 15. In parallel, the cleaning solution 106 is supplied from the cleaning solution supply nozzle 103 onto the semiconductor substrate 101.

In the first brush cleaning step, re-adhesion of the particles 105 is caused by static electricity. After the first brush cleaning in FIG. 15, the second brush cleaning step shown in FIG. 16 is performed. To do so, the arm 203 is rotated to exchange the first cylindrical brush 302 by the second cylindrical brush 312 while rotation of the semiconductor substrate 101 and supply of the cleaning solution 106 are maintained. The second cylindrical brush 312 made of the softer material can clean the semiconductor substrate 101 with generation of static electricity and accompanying re-adhesion of the particles 105 suppressed.

Thereafter, the second cylindrical brush 312 is stopped from rotating and is separated from the semiconductor substrate 101 by moving the support pole 201, thereby terminating the brush cleaning. The two cylindrical brushes 302, 312 are returned to be in the standby state.

Wherein, in the first and second brush cleaning steps, the numbers of rotation of the semiconductor substrate 101 and the first and second cylindrical brushes 302, 312 are set to 50 rpm and 100 rpm, respectively. The first and second brush cleaning steps are preformed for 60 seconds and 10 seconds, respectively. It should be noted that each value is a mere example. As well, the semiconductor substrate cleaning machine in FIG. 14 is a mere example, and the present invention is not limited thereto.

Embodiment 5

A semiconductor substrate cleaning method and a semiconductor substrate cleaning machine according to Embodiment 5 will be described below with reference to the drawings.

Figure 17:
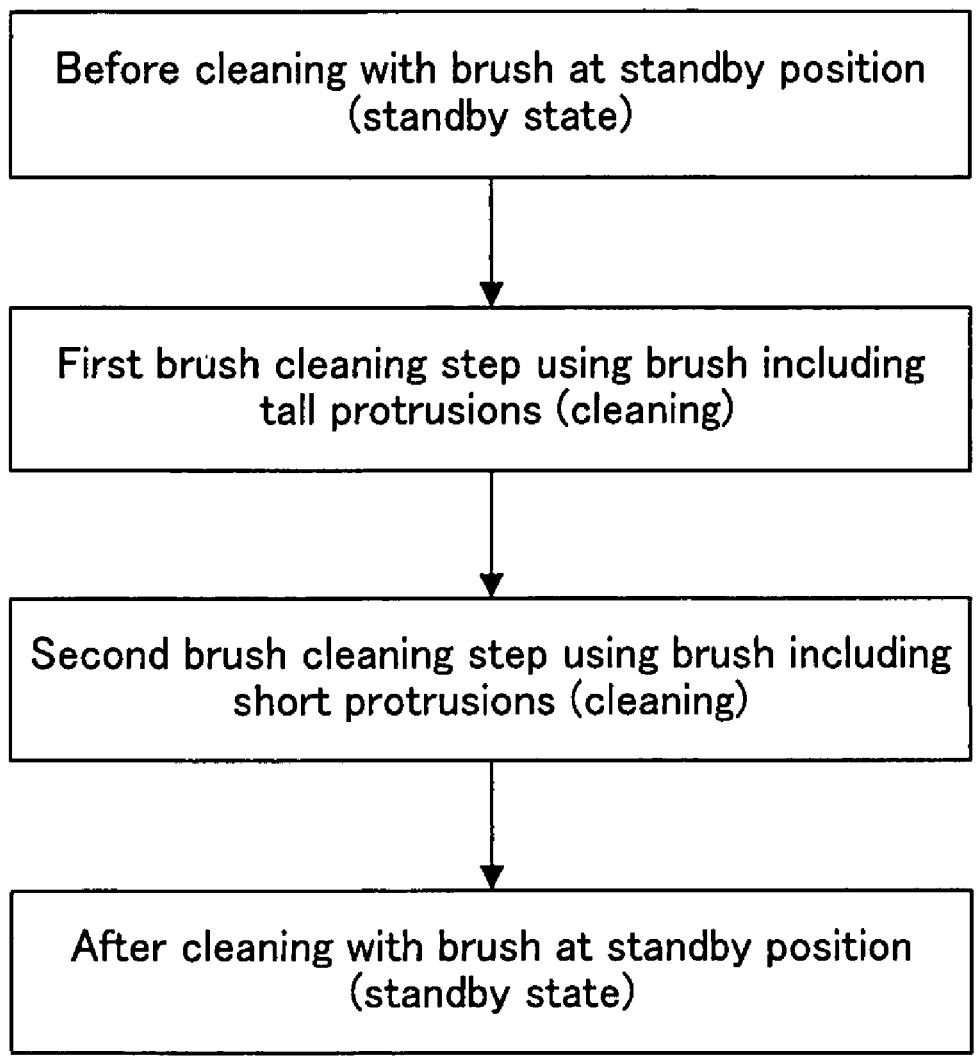
FIG. 17 is a flowchart depicting a flow of a semiconductor substrate cleaning method according to Embodiment 5.

FIG. 17 is a flowchart depicting a flow of the semiconductor substrate cleaning method according to Embodiment 5. The semiconductor substrate cleaning method of the present embodiment includes, similarly to the semiconductor substrate cleaning methods of the above described embodiments, a first brush cleaning step and a second brush cleaning step. In the present embodiment, the protrusions of the brushes are different in height between the first brush cleaning step and the second brush cleaning step. Specifically, the height of the protrusions of a brush used in the second brush cleaning step is smaller than that of the protrusions of a brush used in the first brush cleaning step. The term "tall protrusions and short protrusions" in FIG. 17 implies relative height of the protrusions of the cylindrical brushes used in the respective two steps.

With the protrusions having different height, the pressing pressure of the brush in the second brush cleaning step becomes lower than that in the first brush cleaning step, attaining particle removal with particle re-adhesion by static electricity suppressed. This method eliminates the need to measure the pressing pressures of the brushes and to control the positions of the brushes relative to the semiconductor substrate.

Figure 18:
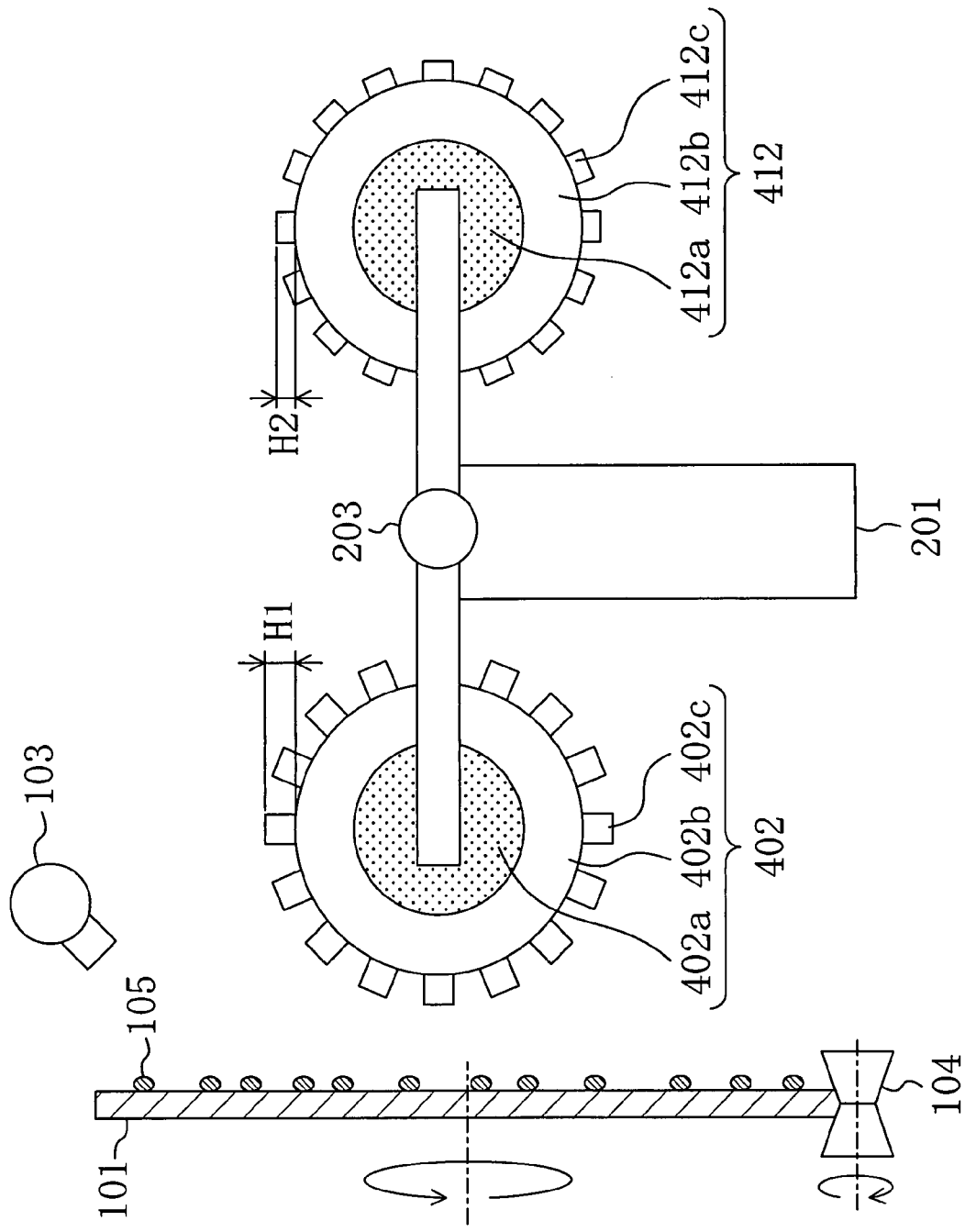
FIG. 18 is an illustration showing a semiconductor substrate cleaning machine according to Embodiment 5 in a state before cleaning in FIG. 17.

FIG. 18 shows a semiconductor substrate cleaning machine that employs the semiconductor substrate cleaning method. Only the two cylindrical brushes are different from those in Embodiments 3 and 4, and therefore, detailed description of the semiconductor substrate cleaning machine in the present embodiment is omitted with the same reference numerals assigned to the same constitutional elements as in the semiconductor substrate cleaning machines in Embodiments 3 and 4. The two cylindrical brushes will be described below.

A first cylindrical brush 402 and a second cylindrical brush 412 have the same constructions as the above described cylindrical brushes, namely, include brush support members 402a, 412a, brush main bodies 402b, 412b, and protrusions 402c, 412c, respectively. Wherein, the two cylindrical brushes 402, 412 are made of the same material, and the outer diameters of the brush main bodies 402b, 412b are equal to each other.

The height H2 of the protrusions 412c of the second cylindrical brush 412 is smaller than the height H1 of the protrusions 402c of the first cylindrical brush 402. Specifically, in the case where each of the brush support members 402a, 412a has a diameter of 55 mm, the height H1 and the height H2 are set to 5 mm and 10 mm, respectively, for example.

With the above arrangement, namely, with the brushes including the support members having the equal diameter and the protrusions having the different height, when the first cylindrical brush 402 is exchanged by the second cylindrical brush 412 by rotating the arm 203, similarly to Embodiment 3, the pressing pressure of the brush against the semiconductor substrate 101 is reduced.

Hence, though particle re-adhesion by static electricity is caused in the first brush cleaning step, it is suppressed in the second brush cleaning step, removing the particles reliably.

The semiconductor substrate cleaning method of the present embodiment will be described below in detail along the flow of FIG. 17.

Figure 19:
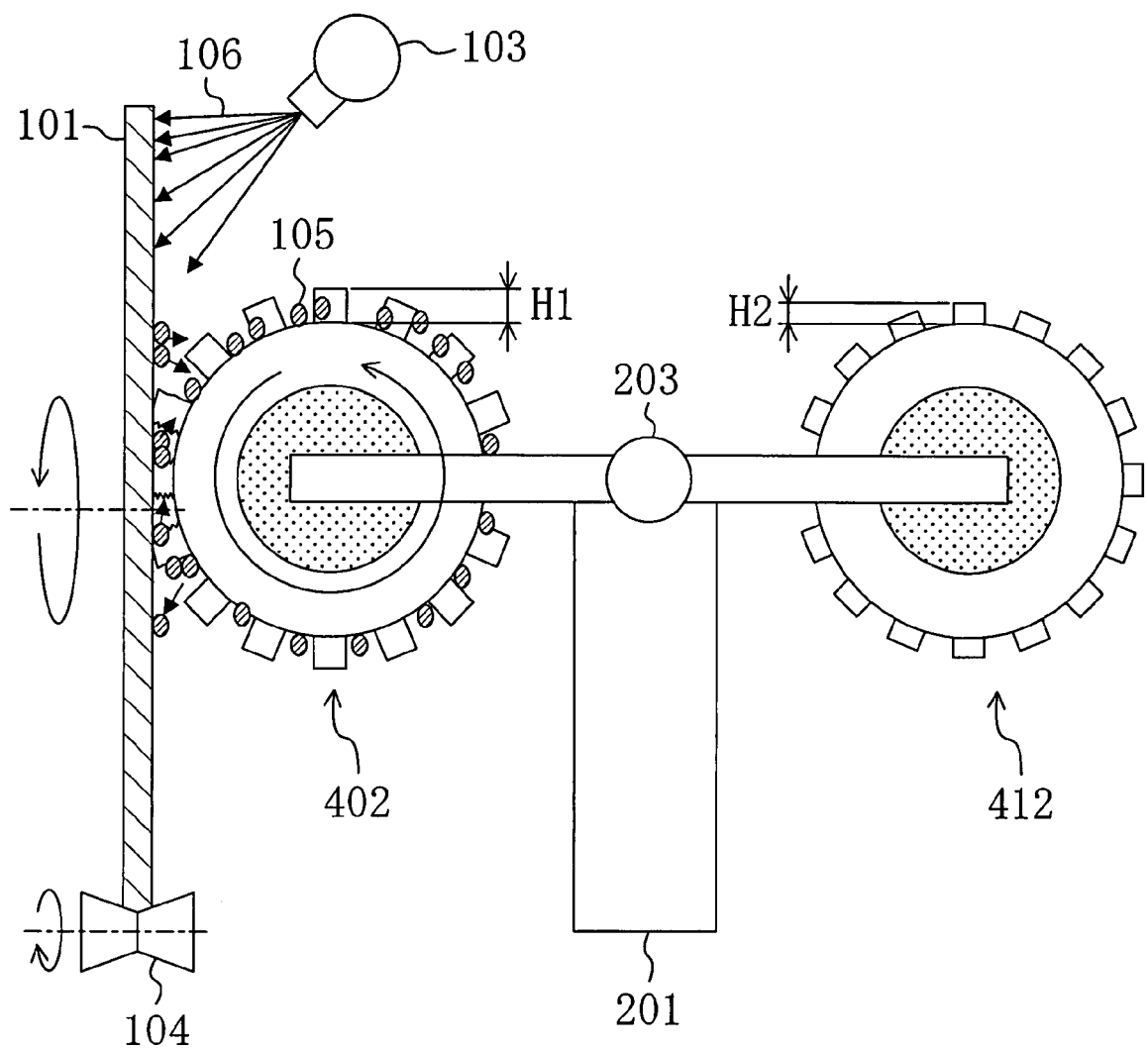
FIG. 19 is an illustration showing a first brush cleaning step using a brush including tall protrusions in the semiconductor substrate cleaning method according to Embodiment 5.

The semiconductor substrate cleaning machine in FIG. 18 is in the standby state before cleaning. Then, similarly to Embodiment 3 and the like, cleaning is performed using the first cylindrical brush 402. FIG. 19 shows the state of the first brush cleaning step.

The first brush cleaning step is performed for 60 seconds with the numbers of rotation of the semiconductor substrate 101 and the first cylindrical brush 402 set to 50 rpm and 100 rpm, respectively. Such the value setting exhibits efficient detachment and removal of the particles 105 adhering to the semiconductor substrate 101 therefrom. The particles 105, however, re-adhere to the semiconductor substrate 101 by static electricity.

Figure 20:
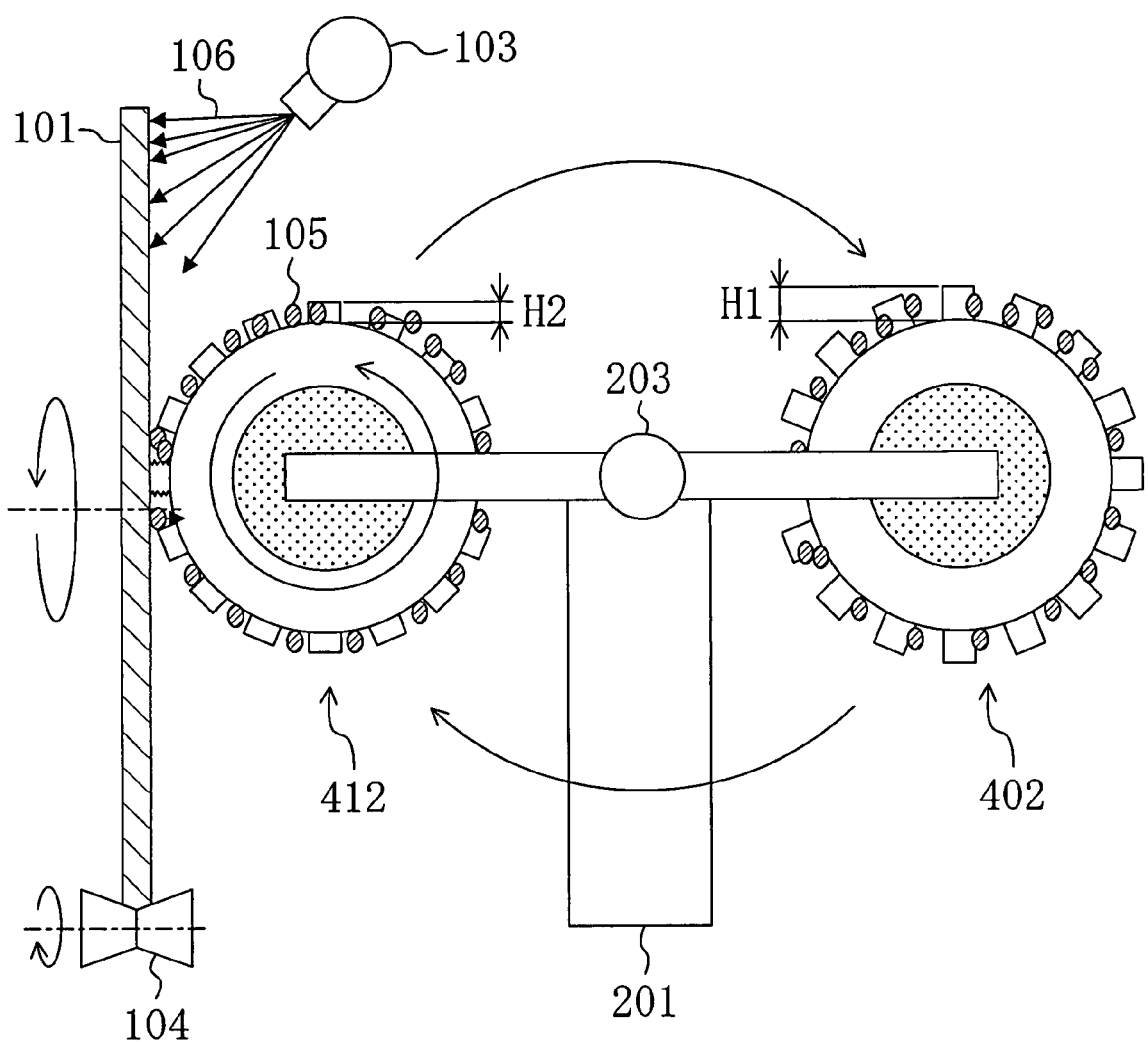
FIG. 20 is an illustration showing a second brush cleaning step using a brush including short protrusions in the semiconductor substrate cleaning method according to Embodiment 5.

Under the circumstances, the second brush cleaning step is performed with the first cylindrical brush 401 exchanged by the second cylindrical brush 412 by rotating the arm 203 after the first brush cleaning step shown in FIG. 19. The state thereof is shown in FIG. 20. The protrusions 412c of the second cylindrical brush 412 is smaller in height than the protrusions 402c of the first cylindrical brush 402, and the outer diameters of the first cylindrical brush 402 and the second cylindrical brush 412 are equal to each other. Accordingly, the pressing pressure of the brush in the second brush cleaning step is lower than the pressing pressure of the brush in the first brush cleaning step to suppress generation of static electricity, thereby suppressing particle re-adhesion.

The second brush cleaning step is performed for 10 seconds with the numbers of rotation of the semiconductor substrate 101 and the second cylindrical brush 412 set to 50 rpm and 100 rpm, respectively.

Thereafter, the second cylindrical brush 412 is stopped from rotating and is separated from the semiconductor substrate 101 by moving the support pole 201, thereby terminating the brush cleaning. Then, the two cylindrical brushes 402, 412 are returned to be in the standby state.

Hence, in the semiconductor substrate cleaning method of the present embodiment, the particles are removed with re-adhesion thereof suppressed, as well.

Embodiment 6

A semiconductor substrate cleaning method and a semiconductor substrate cleaning machine according to Embodiment 6 will be described below with reference to the drawings.

Figure 21:
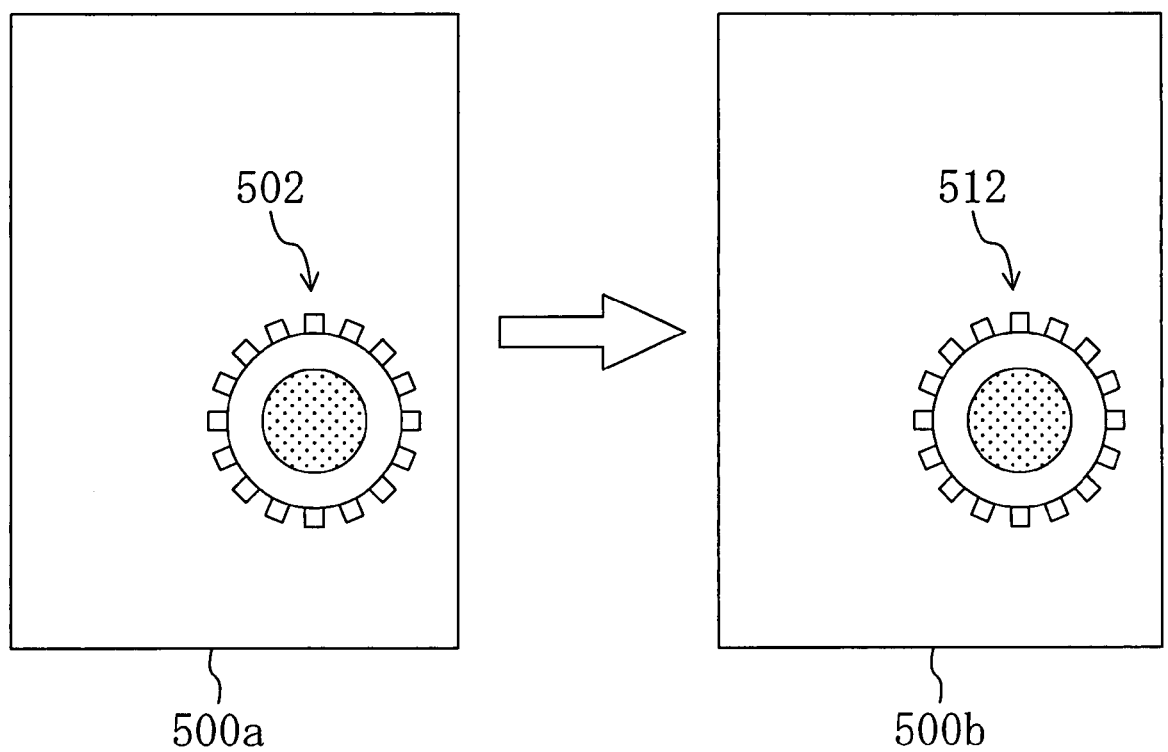
FIG. 21 is an illustration schematically showing a two-stage semiconductor substrate cleaning machine according to Embodiment 6.

The semiconductor substrate cleaning method of the present embodiment is any of the semiconductor substrate cleaning methods of Embodiment 1 to 5 (methods depicted in the flows of FIG. 1, FIG. 6, FIG. 9, FIG. 13, and FIG. 17, respectively) which uses a two-stage semiconductor substrate cleaning machine. FIG. 21 shows schematically the two-stage semiconductor substrate cleaning machine. The semiconductor substrate cleaning machine includes a first stage cleaning mechanism 500a and a second stage cleaning mechanism 500b so that the semiconductor substrate is cleaned in two brushes of the first stage cleaning mechanism 500a and the second stage cleaning mechanism 500b. The first stage cleaning mechanism 500a include a first cylindrical brush 502 while the second stage cleaning mechanism 500b includes a second cylindrical brush 512. Though not shown, the machine includes a roller for supporting and rotating a semiconductor substrate, a cleaning solution supply nozzle for supplying a cleaning solution, and the like, similarly to the machine in FIG. 3. The semiconductor substrate cleaning machine of the present embodiment further includes means for conveying the semiconductor substrate from the first stage cleaning mechanism 500a to the second stage cleaning mechanism 500b.

The first brush cleaning step is performed in the first stage cleaning mechanism 500a so that particles adhering to the surface of the semiconductor substrate are detached therefrom efficiently. In this cleaning, however, static electricity is generated to cause particle re-adhesion. Subsequently, the semiconductor substrate carrying the re-adhering particles is conveyed to the second stage cleaning mechanism 500b and then is subjected to the second brush cleaning. In this cleaning, generation of static electricity is suppressed, with a result that the particles can be removed with re-adhesion thereof to the semiconductor substrate suppressed.

Figure 22:
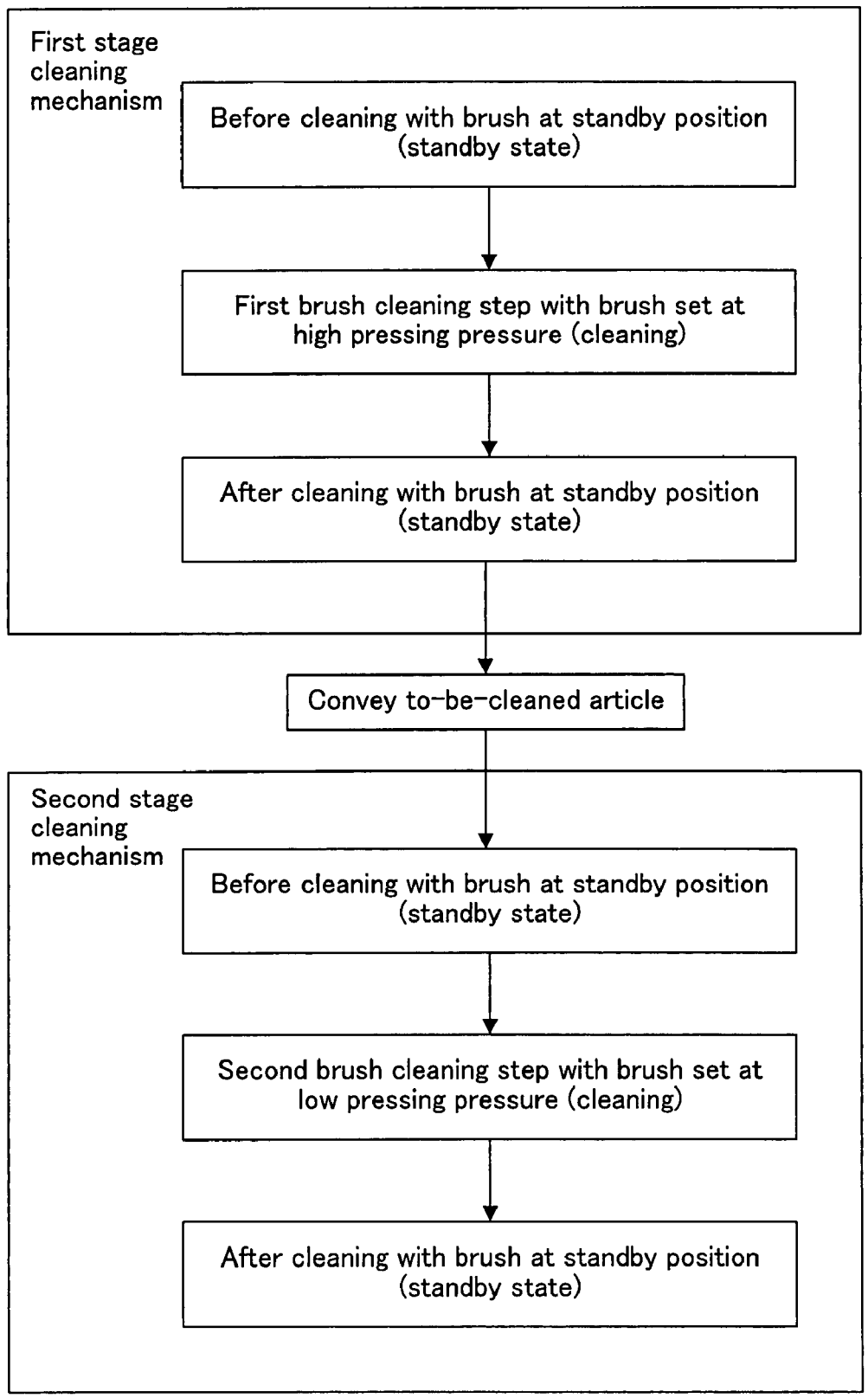
FIG. 22 is a flowchart depicting a flow of a semiconductor substrate cleaning method in Example 1 according to Embodiment 6.

FIG. 22 shows a flow of a cleaning method of Example 1 performed by the two-stage semiconductor substrate cleaning machine and corresponds to the flow of the semiconductor substrate cleaning method of Embodiment 1 shown in FIG. 1. Namely, the first cylindrical brush 502 has the same constitution as the second cylindrical brush 512. Further, the pressing pressure of the first cylindrical brush 502 against the semiconductor substrate is set relatively high in the first stage cleaning mechanism 500a as in FIG. 4 while the pressing pressure of the second cylindrical brush 512 against the semiconductor substrate is set relatively low in the second stage cleaning mechanism 500b as in FIG. 5.

With the above arrangement, the particles re-adhering in the first brush cleaning step can be removed reliably in the second brush cleaning step.

The standby states of the first stage and second stage cleaning mechanism 500a, 500b before cleaning and the standby state after cleaning are the same as those in FIG. 1 and are shown in FIG. 3.

In the case where cleaning is performed by the two-stage semiconductor substrate cleaning machine in this way, the total treatment time period is reduced by sharing the steps by the two cleaning mechanisms, enhancing the efficiency. Further, operations of the respective cleaning mechanisms can be simplified when compared with the case where two kinds of pressing pressure are set in a single chamber of a semiconductor substrate cleaning machine.

Figure 23:
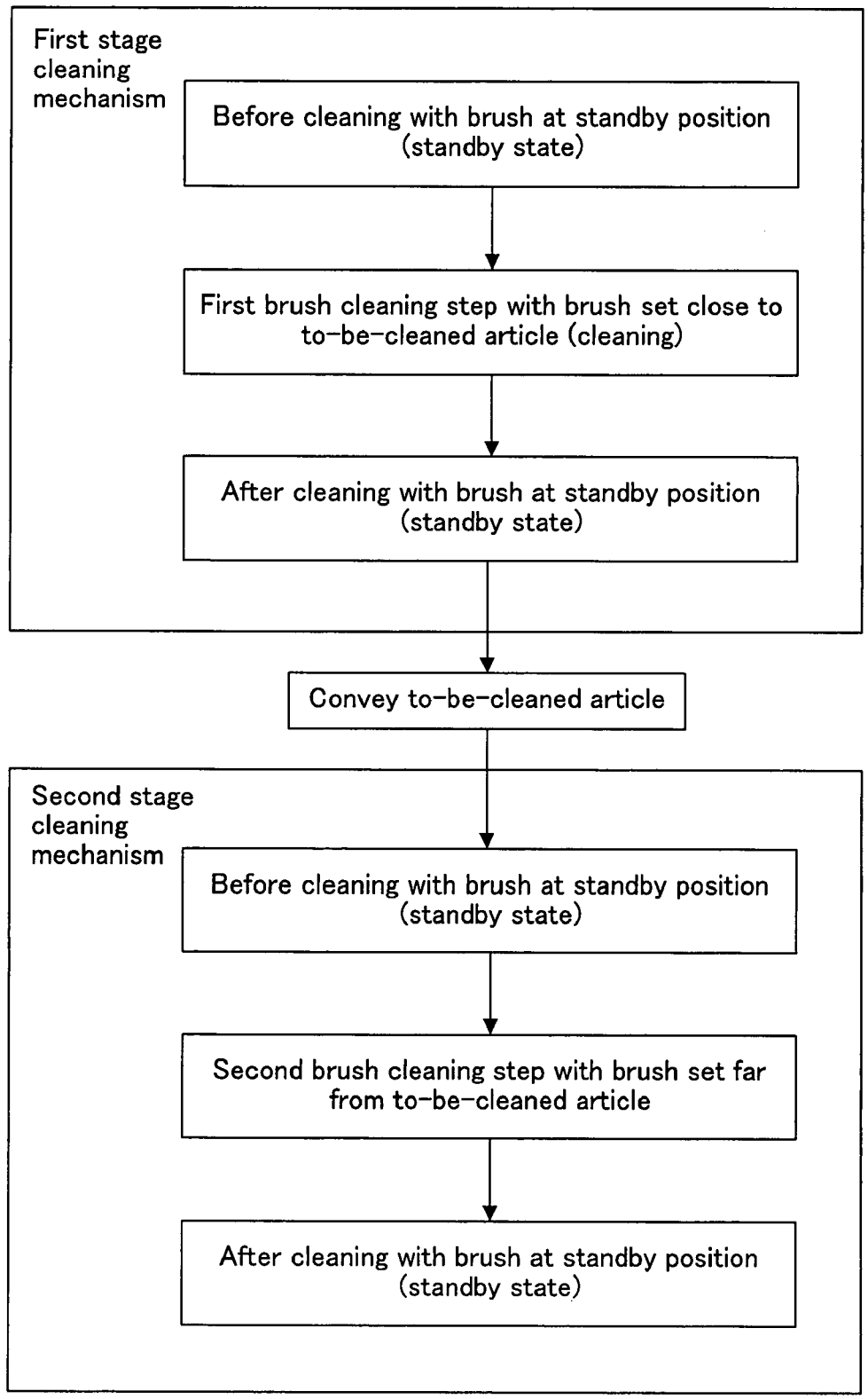
FIG. 23 is a flowchart depicting a flow of a semiconductor substrate cleaning method in Example 2 according to Embodiment 6.

Next, FIG. 23 shows a flow of a cleaning method of Example 2 performed by the two-stage semiconductor substrate cleaning machine and corresponds to the flow of the semiconductor substrate cleaning method of Embodiment 2 shown in FIG. 6. Namely, the first cylindrical brush 502 has the same constitution as the second cylindrical brush 512, similarly to Example 1. Further, the first cylindrical brush 502 is set relatively close to the semiconductor substrate in the first stage cleaning mechanism 500a as in FIG. 7 while the second cylindrical brush 512 is set relatively far from the semiconductor substrate in the second stage cleaning mechanism 500b as in FIG. 8.

With the above arrangement, the semiconductor substrate is cleaned with re-adhesion of to-be-removed particles suppressed.

Figure 24:
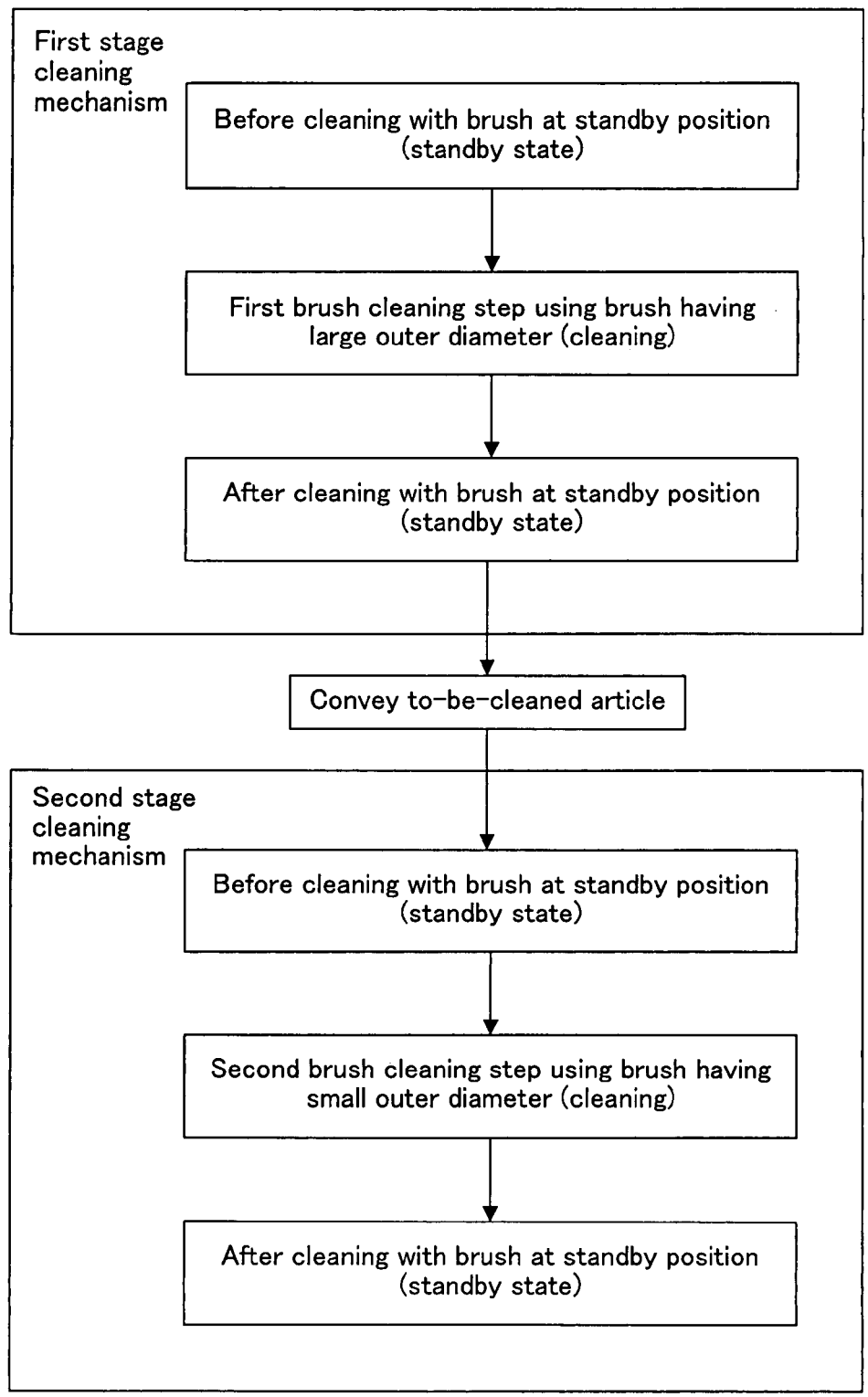
FIG. 24 is a flowchart depicting a flow of a semiconductor substrate cleaning method in Example 3 according to Embodiment 6.

FIG. 24 shows, as well, a flow of a cleaning method of Example 3 performed by the two-stage semiconductor substrate cleaning machine and corresponds to the flow of the semiconductor substrate cleaning method according to Embodiment 3 shown in FIG. 9.

In Embodiment 3, as shown in FIG. 10, the semiconductor substrate is cleaned by the two kinds of brushes exchanged in the single-stage semiconductor substrate cleaning machine. In the present embodiment, which employs the two-stage semiconductor substrate cleaning machine, only one brush is provided for each of the first stage and second stage cleaning mechanisms 500a, 500b, as shown in FIG. 3.

Wherein, similarly to Embodiment 3 shown as in FIG. 10 in which the outer diameter D2 of the second cylindrical brush 212 is smaller than the outer diameter D1 of the first cylindrical brush 202, the outer diameter of the second cylindrical brush 512 of the second stage cleaning mechanism 500b is set smaller than that of the first cylindrical brush 502 of the first-stage cleaning mechanism 500a in Example 3.

With the above arrangement, the semiconductor substrate is cleaned with re-adhesion of to-be-removed particles suppressed in the semiconductor substrate cleaning method of Example 3 of the present embodiment.

Figure 25:
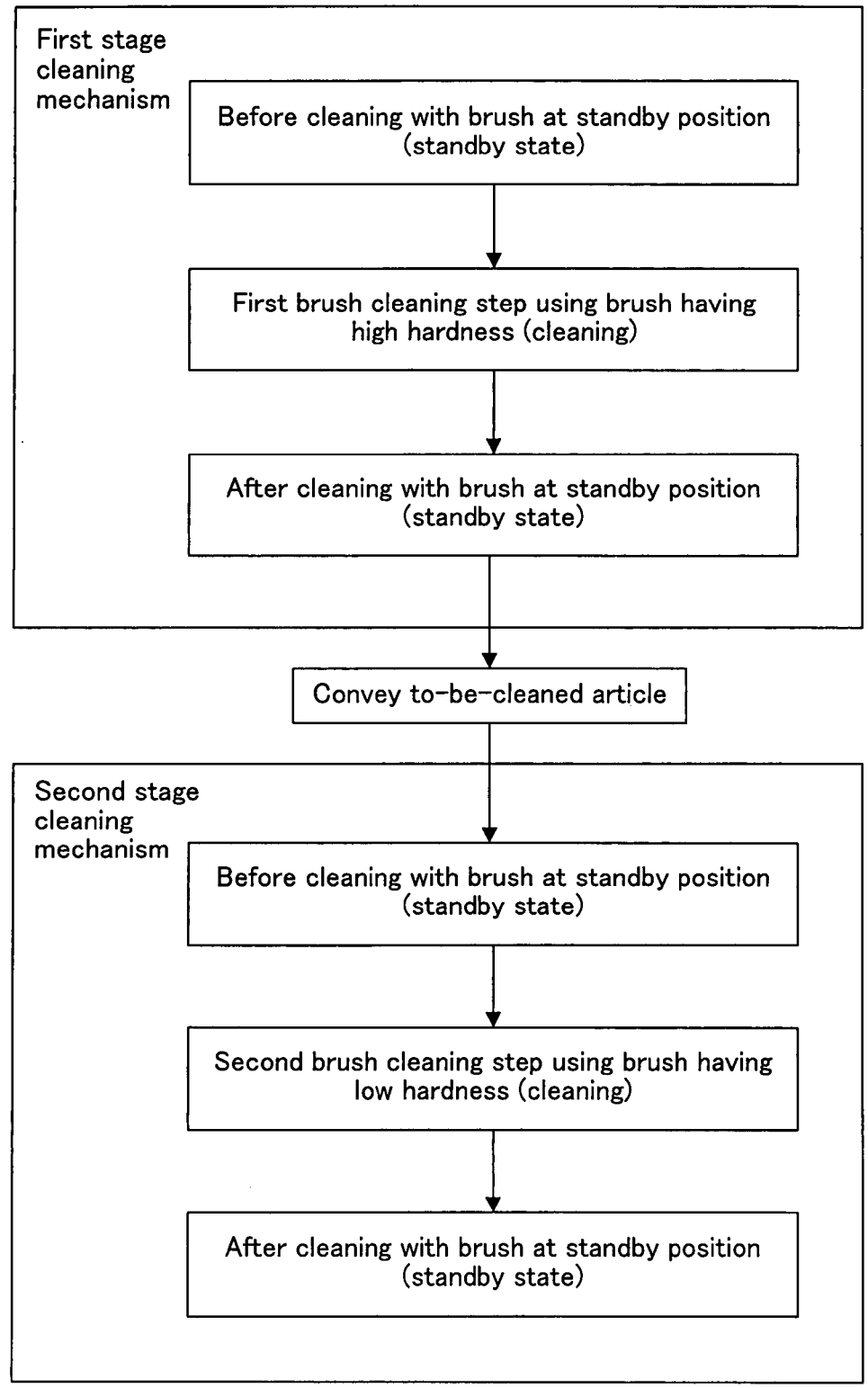
FIG. 25 is a flowchart depicting a flow of a semiconductor substrate cleaning method in Example 4 according to Embodiment 6.
Figure 26:
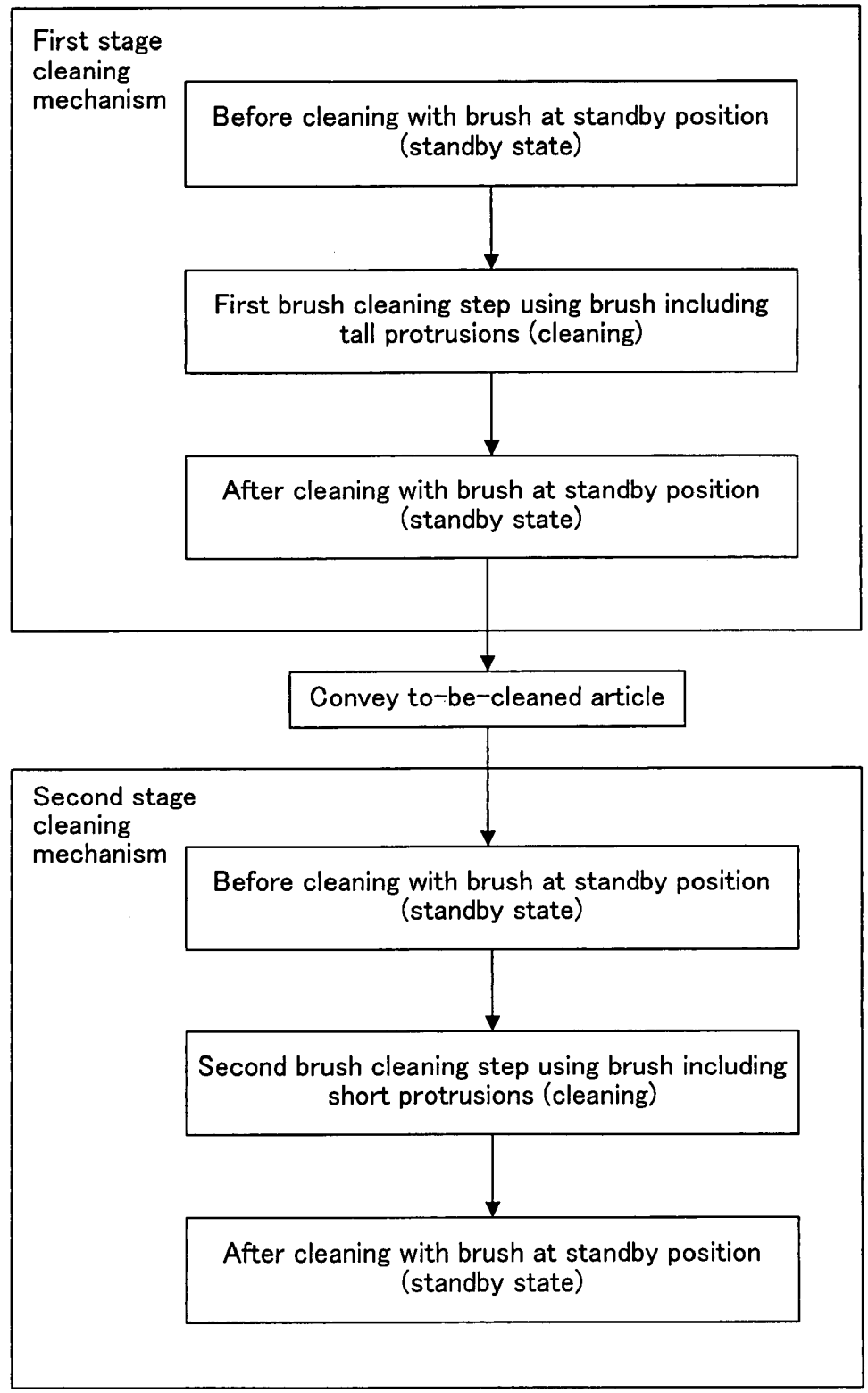
FIG. 26 is a flowchart depicting a flow of a semiconductor substrate cleaning method in Example 5 according to Embodiment 6.
Figure 27:
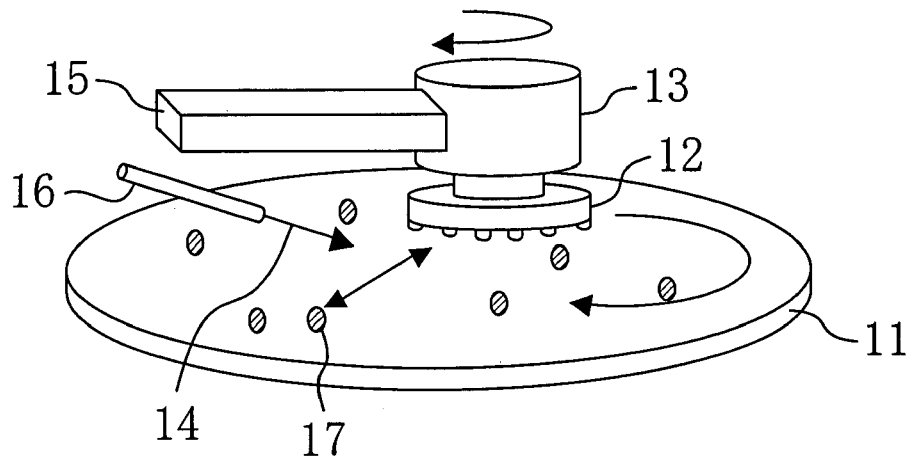
FIG. 27 is an illustration showing a conventional semiconductor substrate cleaning machine using a cup-shaped (disk-shaped) brush.
Figure 28:
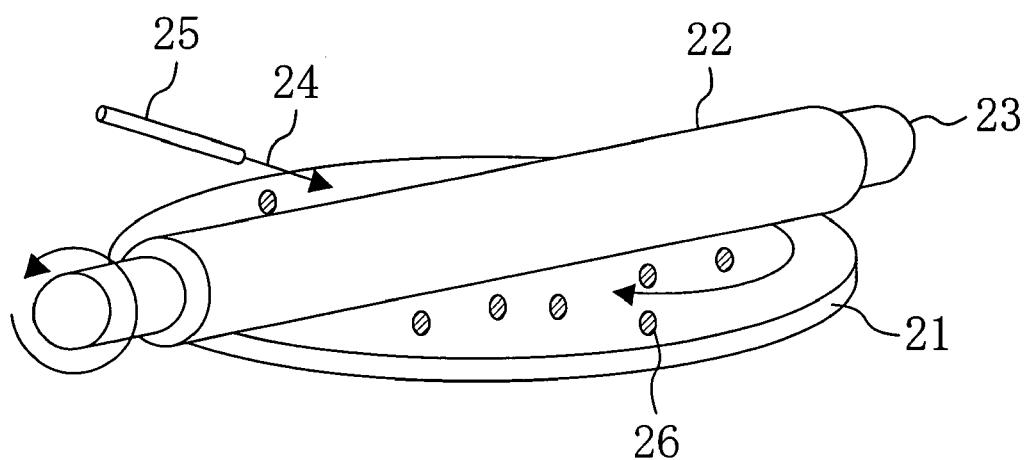
FIG. 28 is an illustration showing a conventional semiconductor substrate cleaning machine using a cylindrical brush.
Figure 29:
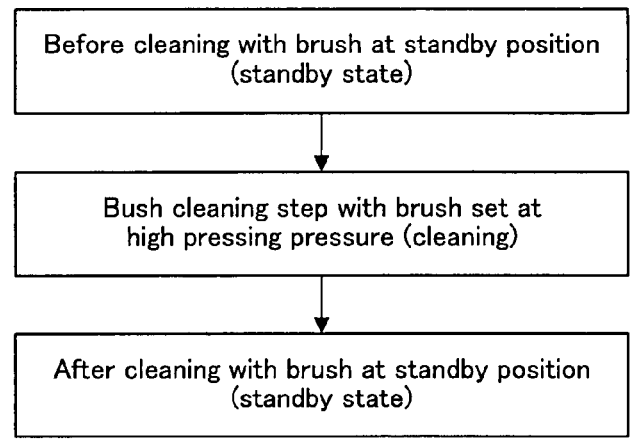
FIG. 29 is a flowchart depicting a flow of a conventional semiconductor substrate cleaning method.
Figure 30:
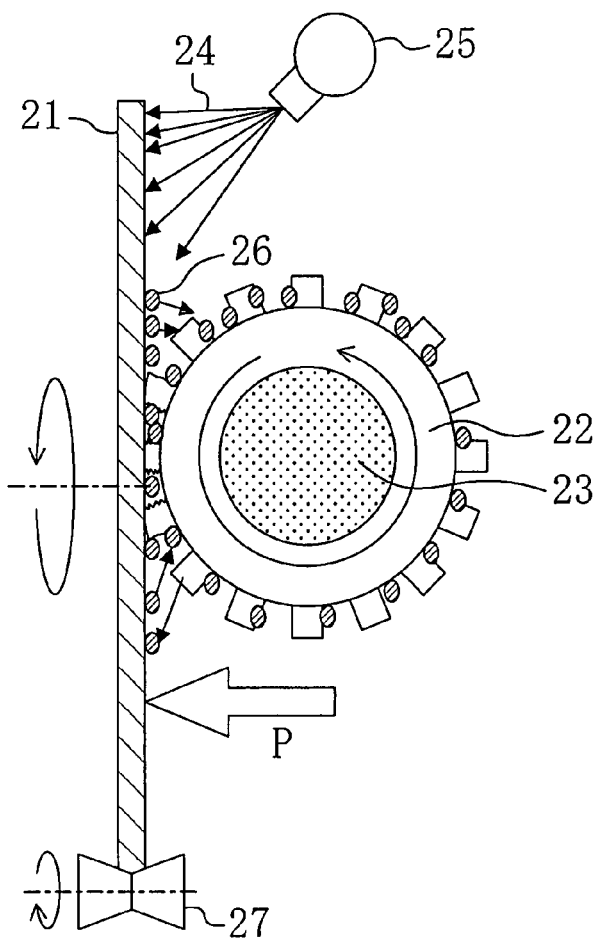
FIG. 30 is an illustration showing a cleaning state in the conventional semiconductor substrate cleaning method.

Moreover, FIG. 25 and FIG. 26 show semiconductor substrate cleaning methods of Example 4 and Example 5 of the present embodiment, respectively, and correspond to Embodiments 4 and 5, respectively. In each of Examples 4 and 5, a machine shown in FIG. 21 in which each cleaning mechanism includes one cylindrical brush is employed as the two-stage semiconductor substrate cleaning machine, similarly to Example 3.

In Example 4, similarly to Embodiment 4, the hardness of the second cylindrical brush 512 is set lower than that of the first cylindrical brush 502. In Example 5, similarly to Embodiment 5, the height of the protrusions of the second cylindrical brush 512 is set smaller than that of the first cylindrical brush 502. With the first and second cylindrical brushes 502, 512 different from each other in such aspects, generation of static electricity is suppressed in the second brush cleaning step when compared with in the first brush cleaning step in either example, achieving cleaning with particle re-adhesion suppressed.

In Examples 2 to 5, similarly to Example 1, the cleaning steps shared by the two cleaning mechanisms reduce the total treatment time period and simplifies the operations of the respective cleaning mechanisms.

The numbers of rotation of the semiconductor substrate and the brushes and the time periods for cleaning are set in Examples 1 to 5 similarly to those in Embodiments 1 to 5, respectively.

Any of the semiconductor substrate cleaning methods and any of the semiconductor substrate cleaning machines in Embodiments 1 to 6 may be combined. For example, between the first brush cleaning step and the second brush cleaning step, both the outer diameters and the hardness of the brushes may be changed. Appropriate combination would achieve further reliable cleaning.

In addition, the cylindrical brushes are used in each embodiment, but equivalent excellent effects can be obtained by providing two brush cleaning steps using a cup-shaped brush with the pressing pressure or the like changed or using cup-shaped brushes having different hardness or the like.

What is claimed is:

1. A semiconductor substrate cleaning method comprising:
a first cleaning step of cleaning a surface of a semiconductor substrate with the use of a cylindrical first brush;
a second cleaning step of cleaning, after the first cleaning step, the surface of the semiconductor substrate with the use of a cylindrical second brush; and
between the first cleaning step and the second cleaning step, a step of moving the first brush away from the surface of the semiconductor substrate, wherein:
the first brush includes a plurality of protrusions extending in a direction substantially vertical to the rotation axis thereof,
the second brush includes a plurality of protrusions extending in a direction substantially vertical to the rotation axis thereof,
in the first cleaning step, the protrusions of the first brush come into contact with the surface of the semiconductor substrate,
in the second cleaning step, the protrusions of the second brush come into contact with the surface of the semiconductor substrate,
a pressing pressure of the protrusions of the second brush against the surface of the semiconductor substrate in the second cleaning step is lower than a pressure of the protrusions of the first brush against the surface of the semiconductor substrate in the first cleaning step,
in the first cleaning step, particles are detached from the surface of the semiconductor substrate,
the particles detached from the surface of the semiconductor substrate re-adhere to the surface of the semiconductor substrate due to static electricity generated in the first cleaning step, and
in the second cleaning step, the particles re-adhering to the surface of the semiconductor substrate are removed.

2. The semiconductor substrate cleaning method of claim 1, wherein the first brush is identical with the second brush.

3. The semiconductor substrate cleaning method of claim 1, wherein the position of a main body of the second brush in the second cleaning step is farther than the position of a main body of the first brush in the first cleaning step relative to the semiconductor substrate.

4. The semiconductor substrate cleaning method of claim 1, wherein the diameter of the second brush is smaller than the diameter of the first brush.

5. The semiconductor substrate cleaning method of claim 1, wherein the second brush is made of a material softer than the first brush.

6. The semiconductor substrate cleaning method of claim 1, wherein each of the first brush and the second brush includes a brush main body and protrusions provided at the surface of the brush main body, and the height of the protrusions of the second brush is smaller than the height of the protrusions of the first brush.

7. The semiconductor substrate cleaning method of claim 1, wherein the first cleaning step and the second cleaning step are performed by a single cleaning machine.

8. The semiconductor substrate cleaning method of claim 1, wherein the first cleaning step and the second cleaning step are performed by separate cleaning machines.

9. The semiconductor substrate cleaning method of claim 1, wherein diluted hydrofluoric acid, ammonium water, organic acid, or functional water is used as a cleaning solution.

10. The semiconductor substrate cleaning method of claim 1, wherein the first brush and the second brush are made of a macromolecular material.

11. The semiconductor substrate cleaning method of claim 1, wherein the second cleaning step is performed under a condition that suppresses recontamination of the surface of the semiconductor substrate in comparison with the first cleaning step.

* * * * *

UNITED STATES PATENT AND TRADEMARK OFFICE
CERTIFICATE OF CORRECTION

PATENT NO. : 7,704,329 B2
APPLICATION NO. : 11/702529
DATED : April 27, 2010
INVENTOR(S) : Kenji Kobayashi et al.

It is certified that error appears in the above-identified patent and that said Letters Patent is hereby corrected as shown below:

ON THE TITLE PAGE:

In Item "(73) Assignee", add --Renesas Technology Corp., Tokyo, (JP)--

Signed and Sealed this
Tenth Day of May, 2011

David J. Kappos
*Director of the United States Patent and Trademark Office*